(12) United States Patent
Gupta et al.

(10) Patent No.: US 10,867,668 B2
(45) Date of Patent: Dec. 15, 2020

(54) AREA EFFICIENT WRITE DATA PATH CIRCUIT FOR SRAM YIELD ENHANCEMENT

(71) Applicant: QUALCOMM Incorporated, San Diego, CA (US)

(72) Inventors: Sharad Kumar Gupta, Bangalore (IN); Pradeep Raj, Bangalore (IN); Rahul Sahu, Bangalore (IN); Mukund Narasimhan, Bangalore (IN)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 15/727,448

(22) Filed: Oct. 6, 2017

(65) Prior Publication Data

US 2019/0108872 A1   Apr. 11, 2019

(51) Int. Cl.
  *G11C 11/419* (2006.01)
  *G11C 7/12* (2006.01)
(52) U.S. Cl.
  CPC .............. *G11C 11/419* (2013.01); *G11C 7/12* (2013.01)
(58) Field of Classification Search
  CPC ..................................................... G11C 7/12
  USPC ................................................... 365/230.06
  See application file for complete search history.

(56) References Cited

U.S. PATENT DOCUMENTS

| 5,828,610 | A * | 10/1998 | Rogers ................. G11C 7/1072 365/203 |
| 8,451,679 | B1 | 5/2013 | Sharpe-Geisler et al. |
| 9,401,201 | B1 | 7/2016 | Jung et al. |
| 2003/0012048 | A1 | 1/2003 | Chappell et al. |
| 2003/0165073 | A1* | 9/2003 | Lien ...................... G11C 15/00 365/49.17 |
| 2010/0020591 | A1 | 1/2010 | Houston |
| 2010/0188909 | A1 | 7/2010 | Kenkare et al. |
| 2011/0149667 | A1* | 6/2011 | Hamzaoglu ........... G11C 11/412 365/203 |
| 2014/0219009 | A1 | 8/2014 | Chow et al. |
| 2015/0131368 | A1 | 5/2015 | Adams et al. |

(Continued)

FOREIGN PATENT DOCUMENTS

WO   2017053068 A1   3/2017

OTHER PUBLICATIONS

International Search Report and Written Opinion—PCT/US2018/048824—ISA/EPO—dated Nov. 28, 2018.

*Primary Examiner* — Min Huang
(74) *Attorney, Agent, or Firm* — Arent Fox, LLP

(57) ABSTRACT

A memory and method of performing a write operation in a memory are disclosed. In one aspect of the disclosure, the memory includes a memory cell, a pair of bit lines coupled to the memory cell, a multiplexer, and a pull-up circuit coupled to the multiplexer. The multiplexer may be configured to select the pair of bit lines coupled to the memory cell during the write operation. To increase the write performance of the memory cell, the pull-up circuit is configured to select which of the pair of bit lines is a non-zero bit line during the write operation and to clamp the non-zero bit line through the multiplexer to approximately a power rail voltage. Thus, the pull-up circuit may increase the voltage difference between the non-zero bit line and the zero bit line during the write operation and thus decrease the area and power consumed by a boost capacitance.

32 Claims, 6 Drawing Sheets

(56) References Cited

U.S. PATENT DOCUMENTS

| | | | |
|---|---|---|---|
| 2015/0332756 A1* | 11/2015 | Kuenemund | G11C 8/18 |
| | | | 365/154 |
| 2015/0364184 A1* | 12/2015 | Park | G11C 7/12 |
| | | | 365/156 |
| 2016/0071606 A1* | 3/2016 | Kodama | G11C 16/26 |
| | | | 365/185.21 |
| 2016/0203857 A1 | 7/2016 | Chandra et al. | |
| 2017/0053695 A1* | 2/2017 | Sonkar | G11C 7/18 |

* cited by examiner

AREA EFFICIENT WRITE DATA PATH CIRCUIT FOR SRAM YIELD ENHANCEMENT

BACKGROUND

Field

The present disclosure relates generally to memory systems, and more particularly, to apparatuses incorporating the memory systems for performing write operations.

Background

As integrated circuit (IC) technology advances, semiconductor manufacturing processes continue to scale down feature sizes and provide denser ICs. This trend continues to be prevalent with memory used to store data in digital processing systems. In general, as the feature sizes decrease, the memory can store more and more data in a given area of the IC. However, smaller feature sizes can also result in increasing resistance characteristics and performance variations that cause unreliable memory performance.

For instance, Static Random Access Memory (SRAM) is a type of Random Access Memory (RAM) that stores data in SRAM memory cells so long as the SRAM is powered. SRAM is often used in the sequential logic circuits of digital processing circuitry to store data generated by combination logic. SRAM is typically formed by a Complementary Metal Oxide Semiconductor (CMOS) IC. However, as the feature sizes of the CMOS IC continue to decrease, the resistance of the components in the SRAM have increased significantly. For example, the resistances of bit lines used to write data to the SRAM memory cells have doubled or even quadrupled when feature sizes are between 14 nm and 10 nm. Additionally, smaller feature sizes may result in field effect transistors (FETs) with increased gate resistances due to short channel effects and strength disbalance between P-channel FETs (PFETs) and N-channel FETs (NFETs) of SRAM memory cells. The cell write sigma of SRAM memory cells may thus decrease at these smaller feature sizes and result in SRAM memory cells that are unable to perform write operations. Thus, write assist techniques are needed to improve the write operations of memory (such as SRAM), particularly at smaller feature sizes.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. The summary's sole purpose is to present some concepts of one or more aspects in a simplified form as a prelude to the more detailed description that is presented later.

In an aspect of the disclosure, a method and an apparatus are provided. For example, the apparatus may be a memory such as SRAM. The apparatus may include a memory cell, a pair of bit lines coupled to the memory cell, a multiplexer, and a pull-up circuit coupled to the multiplexer. The multiplexer may be configured to select the pair of bit lines coupled to the memory cell during a write operation. To increase the write performance of the memory cell, the pull-up circuit is configured to select which of the pair of bit lines is a non-zero bit line during the write operation and to clamp the non-zero bit line through the multiplexer to approximately a power rail voltage. Thus, the pull-up circuit may increase the voltage difference between the non-zero bit line and the zero bit line during the write operation, which increases the reliability of the write operation. The increase in the voltage difference provided by the pull-up circuit may also reduce a boost capacitance needed to perform the write operation, thereby decreasing the area and power consumed by the boost capacitance.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
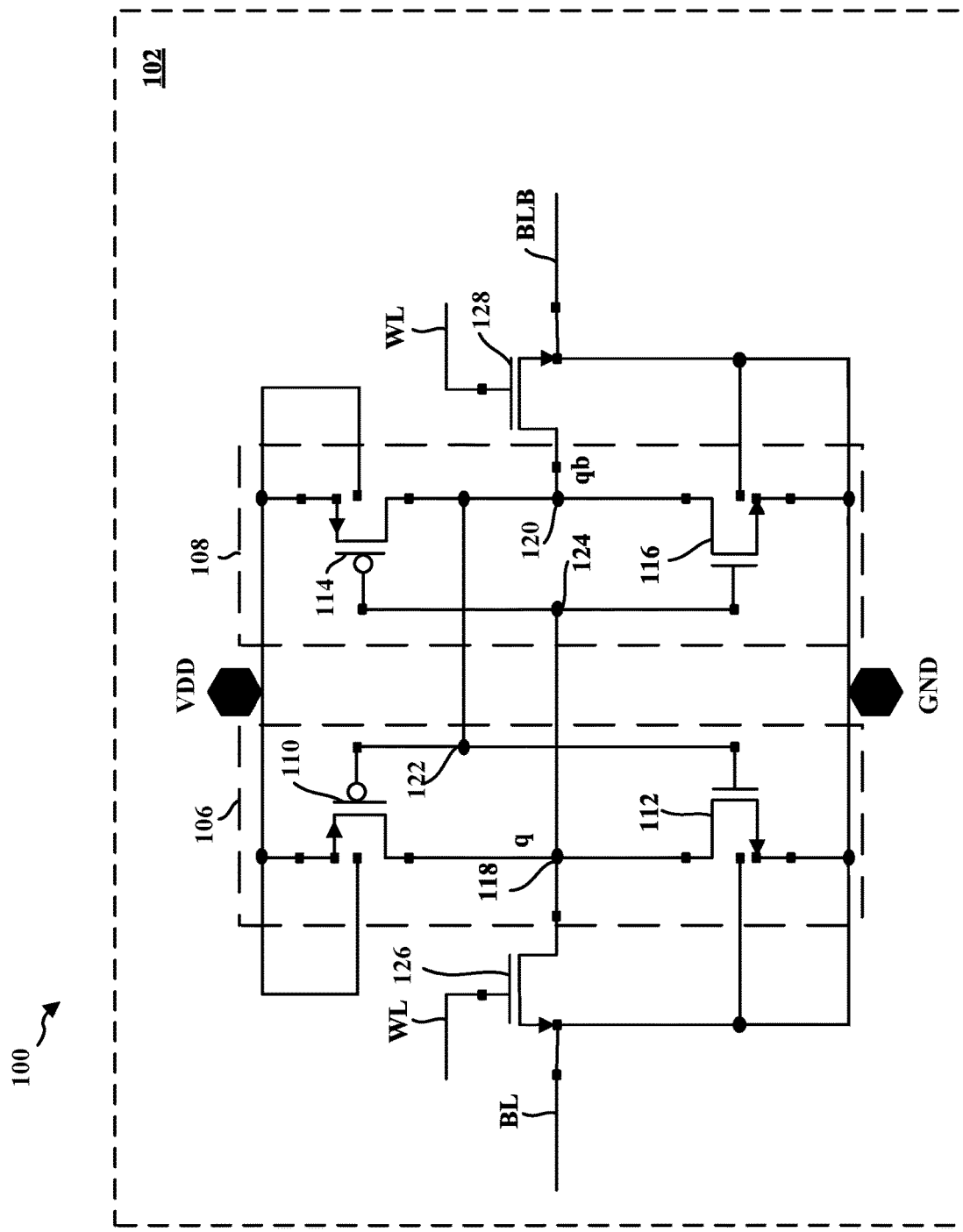
FIG. 1 is a circuit diagram of an exemplary memory cell.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that the concepts may be practiced without these specific details. In some instances, well-known structures and components are shown in block diagram form in order to avoid obscuring such concepts. Acronyms and other descriptive terminology may be used merely for convenience and clarity and are not intended to limit any concept disclosed herein.

Various memories presented throughout the disclosure may be implemented as a stand-alone memory. Such aspects may also be included in an IC or a system/apparatus, or a portion of an IC or a portion of a system/apparatus (e.g., modules, components, circuits, or the like residing in an integrated circuit or part of an integrated circuit), or an intermediate product where an integrated circuit or a system/apparatus is combined with other integrated circuits or systems (e.g., a video card, a motherboard, etc.) or an end product (e.g., mobile phone, personal digital assistant (PDA), Internet of Things device, desktop computer, laptop computer, palm-sized computer, tablet computer, work station, game console, media player, computer based simulators, wireless communication attachments for laptops, or the like).

The word "exemplary" is used herein to mean serving as an example, instance, or illustration. Any embodiment described herein as "exemplary" is not to be construed as preferred or advantageous over other embodiments. Likewise, the term "embodiment" of an apparatus does not require that all embodiments of the invention include the described components, structure, features, functionality, processes, advantages, benefits, or modes of operation.

The terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements may be physical, logical, or a combination thereof. As used herein, two elements may be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Any reference to an element herein using a designation such as "first," "second," and so forth does not limit the quantity or order of the element. Rather, the designations are used herein as a convenient method of distinguishing between two or more elements or instances of an element. Thus, a reference to first and second elements does not mean that only two elements can be employed, or that the first element must precede the second element. As used herein, references to the plural include the singular, and references to the singular include the plural.

Various aspects of a memory will now be presented in the context of SRAM.

SRAM is volatile memory that retains data while the memory remains powered. However, as those skilled in the art will readily appreciate, such aspects may be extended to other memories and/or circuit configurations. Examples of other memories may include RAM, dynamic RAM (DRAM), synchronous dynamic RAM (SDRAM), double data rate RAM (DDRAM), read only memory (ROM), programmable ROM (PROM), erasable PROM (EPROM), electrically erasable PROM (EEPROM), a general register on a processor, flash memory, or any other suitable memory. Accordingly, while SRAM may be used in the various examples described herein, references to SRAM are intended to illustrate exemplary aspects of other memory types in addition to SRAM. For example, aspects described with respect to SRAM may be applied RAM, DRAM, SDRAM, DDRAM, ROM, PROM, EPROM, OR EEPROM, to name a few, with the understanding that such aspects may be extended to a wide range of applications.

FIG. 1 illustrates a circuit diagram 100 of one example of a memory cell 102 that may be used to store a single bit of data (e.g., logic 1 or logic 0). The memory cell 102 may be part of a memory 104 (See FIG. 2 and FIG. 4). In one aspect, the memory 104 includes at least one array of memory cells, like the memory cell 102, each storing a different bit of data. The memory 104 may be any suitable storage medium, such as, by way of example, an SRAM. The exemplary memory cell 102 shown in FIG. 1 is a type of SRAM memory cell. However, as those skilled in the art will readily appreciate, the memory 104 is not necessarily limited to SRAM. In FIG. 1, the memory cell 102 is implemented as an SRAM memory cell with a six-transistor (6T) configuration. However, as those skilled in the art will readily appreciate, other examples of an SRAM memory cell may be implemented with a four-transistor (4T) configuration. Additionally, other examples of memory cells that may be provided in the memory 104 are RAM memory cells, DRAM memory cells, SDRAM memory cells, DDRAM memory cells, ROM memory cells, PROM memory cells, EPROM memory cells, OR EEPROM memory cells, to name a few.

Referring again to the circuit diagram in FIG. 1, the memory cell 102 is shown with two inverters 106, 108. The inverter 106 includes a PFET 110 and an NFET 112 while the inverter 108 includes a PFET 114 and an NFET 116. In the described embodiment, the inverters 106 and 108 are powered by power rail voltage VDD and have a return to a ground rail voltage GND, which is lower than the power rail voltage VDD and provides a reference voltage of 0V for the memory 104, including the memory cell 102. A source of the PFET 110 and a source of the PFET 114 are each coupled to receive the power rail voltage VDD. In this example, a body of the PFET 110 and a body of the PFET 114 are each coupled to receive the power rail voltage VDD. A source of the NFET 112 and a source of the NFET 116 are each coupled to receive the ground rail voltage GND. Additionally, a body of the NFET 112 and a body of the NFET 116 are each also coupled to receive the ground rail voltage GND.

The inverters 106, 108 are interconnected to form a cross-coupled differential latch. More specifically, a drain of the PFET 110 and a drain of the NFET 112 are coupled to one another so as to form an output storage node 118 of the inverter 106 and a drain of the PFET 114 and a drain of the NFET 116 are coupled to one another so as to form an output storage node 120 of the inverter 108. Furthermore, a gate of the PFET 110 and a gate of the NFET 112 are coupled to one another so as to form an input node 122 of the inverter 106 and a gate of the PFET 114 and a gate of the NFET 116 are coupled to one another so as to form an input node 124 of the inverter 108.

As shown in FIG. 1, the output storage node 118 of the inverter 106 is directly connected to the input node 124 of the inverter 108 and the output storage node 120 of the inverter 108 is directly connected to the input node 122 of the inverter 106. Accordingly, the inverters 106, 108 form a latch that is cross-coupled.

In this example, the output storage node 118 is configured to store a logical state of a bit, q, and the output storage node 120 is configured to store a logical state of a bit, qb. Given the input/output configuration of the inverters 106, 108, the bit qb is a complement of the bit q. Thus, after read/write transitions, the logical state of the bit qb is a complement of the logical state of the bit q. For example, when the logical state of the bit q is stored at the output storage node 118 at logic 1, the logical state of the bit qb is stored at the output storage node 120 at logic 0. Additionally, when the logical state of the bit q is stored at the output storage node 118 at logic 0, the logical state of the bit qb is stored at the output storage node 120 at logic 1. Accordingly, a single bit of data is stored by the memory cell 102 as a pair of differential bits q, qb that provide a pair of differential logical states corresponding to the logical state of a single stored bit of data. As a result, the latch formed by the inverters 106, 108 is also a differential latch.

A pair of access NFETs 126, 128 control access to the output storage nodes 118, 120 of the memory cell 102 during read and write operations. More specifically, the access NFET 126 is coupled between the output storage node 118 of the inverter 106 and a bit line BL while the access NFET 128 is coupled between the output storage node 120 of the inverter 108 and a bit line BLB (the value of which is the opposite or inverse of the bit line BL). The gates of the access NFETs 126, 128 are each coupled to a word line WL. In particular, when the memory cell 102 is selected for a write operation or for a read operation, the word line WL is asserted thereby turning on the access NFETs 126, 128. Furthermore, the bit lines BL, BLB coupled to the memory cell 102 are selected by a multiplexer in the memory 104, as explained in further detail below. In this manner, the output storage node 118 may be accessed by the bit line BL through the access NFET 126 and the output storage node 120 may be accessed by the bit line BLB through the access NFET 128 to perform the read or write operation on the memory cell 102. When a read or write operation is not being performed on the memory cell 102, the word line WL may be unasserted and/or the multiplexer does not select the pair of bit lines BL, BLB coupled to the memory cell 102.

Ideally, a write operation may be initiated by asserting the word line WL and by setting the bit lines BL and BLB to the differential logical states that correspond to the bit to be written to the memory cell 102. The word line WL may be asserted before or after the value to be written (e.g., write data) is provided to the bit lines BL and BLB. By way of example, ideally a logic 1 may be written to the memory cell 102 by setting the bit line BL to a logical state of logic 0 and the bit line BLB to a logical state of logic 1. The logical state of logic 0 at the bit line BL is applied to the input node 124 of the inverter 108 through the access NFET 126, which ideally should force the output storage node 120 of the inverter 108 to approximately the power rail voltage VDD, which corresponds to a logical state of logic 1. In the ideal example, the logical state of logic 1 of the bit line BLB is applied to the input node 122 of the inverter 106, which in turn ideally forces the output storage node 118 of the inverter 106 to the ground rail voltage GND which corresponds to a logical state of logic 0. A logical state 0 is ideally written to the memory cell 102 by inverting the values of the bit lines BL and BLB.

However, as device sizes shrink, the memory cell 102 is incapable of performing the write operation as ideally described above without a write assist when the differential logical states are to be flipped (e.g., from q=1, qb=0 to q=0 to qb=1) by the write operation. For example, this may be the case when the memory 104 is formed by a CMOS IC having a feature size of a 14 nm or smaller. Write operations to SRAM memory cells require a high write sigma otherwise the write operation is degraded. However, the voltage of the non-zero bit line (i.e., whichever one of the bit lines BL, BLB is set to the logical state of logic 1) may drop significantly during the write operation due to bit line resistance and gate resistances. For example, the bit line resistances and gate resistances may increase the threshold voltages of the access NFETs 126, 128 and create strength imbalances between the PFETs 110, 114 and the NFETs 112, 116 of the inverters 106, 108.

The drop in the voltage of the non-zero bit line puts the SRAM memory cell into what can be referred to as a "shadow read mode." This is due to the feedback configuration of the memory cell 102 given the increased resistances. More specifically, the non-zero bit line (i.e., whichever one of the bit lines BL, BLB is set to the logical state of 1) is attempting to flip the stored bit (whichever bit q, qb that the non-zero bit line is attempting to flip) of one of the output storage nodes 118, 120 from a logical state of logic 0 to a logical state of logic 1. However, the input node 122, 124 that is connected to the output storage nodes 118, 120 coupled to the non-zero bit line receives the current logical state of logic 0. The PFET 110, 114 that is controlled by the input node 122, 124 that receives the current logical state of logic 0 tends to pull up its output storage node 118, 120, which is the other output storage node 118, 120 coupled to the zero bit line (i.e., the one of the bit lines BL, BLB set to a logical state of logic 0). Given the voltage drop of the non-zero bit line, the voltage difference between the bit lines BL, BLB may be insufficient to overcome the feedback of the memory cell 102, and thus the memory cell 102 may be incapable of flipping the logical states of the stored bits q, qb at the output storage nodes 118, 120 and the write operation may by fail without a write assist.

Figure 2:
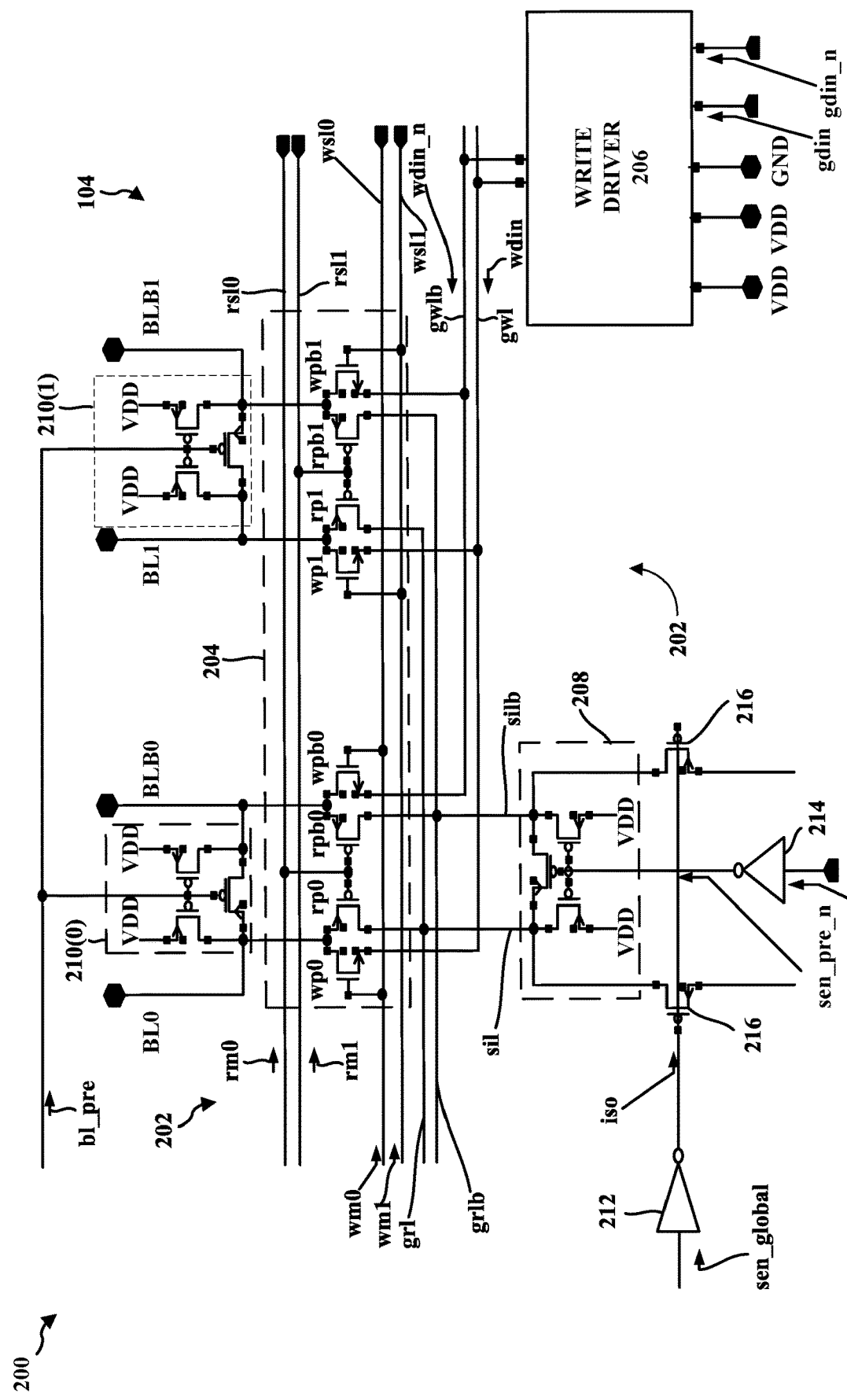
FIG. 2 is a circuit diagram of memory circuitry that may be used during a write operation to write to the memory cell shown in FIG. 1.

FIG. 2 illustrates a circuit diagram 200 of memory circuitry 202, which may be provided as part of the memory 104. The memory circuitry 202 is operable to provide a write assist that increases the voltage difference between the bit lines BL, BLB so that the memory cell 102 is capable of flipping the logical states of the stored bits q, qb at the output storage nodes 118, 120 during the write operation. The memory circuitry 202 shown in FIG. 2 is capable of overcoming the feedback of the memory cell 102 despite the voltage drop of the non-zero bit line, as explained in further detail below.

The memory circuitry 202 includes a plurality of pairs of bit lines. For the sake of simplicity, the memory circuitry 202 is shown with two pairs of bit lines (a pair of bit lines BL0, BLB0 and a pair of bit lines BL1, BLB1). It should be noted that the memory circuitry 202 may include any number of pairs of bit lines depending on the storage capabilities and topology of the memory 104. As explained above, at least one array of memory cells may be provided in the memory 104. Each of the memory cells may be identical to the memory cell 102 shown in FIG. 1. A column of the memory cells is coupled between each pair of bit lines. Thus, a column of the memory cells is coupled between the pair of bit lines BL0, BLB0. Additionally, a column of the memory cells is coupled between the pair of bit lines BL1, BLB1. Rows of the memory cells are also provided in the memory 104 and word lines are provided to select the rows of memory cells. More specifically, each row of the memory cells may be connected to one of the word lines. For example, the row of memory cells that include the memory cell 102 shown in FIG. 1 are all coupled to the word line WL.

The memory circuitry 202 shown in FIG. 2 includes a multiplexer 204, a write driver 206, precharging circuit 208, precharging circuit 210(0), precharging circuit 210(1), an inverter gate 212, an inverter gate 214, and a pair of isolation PFETs 216. In addition to the pairs of bit lines (e.g., BL0, BLB0 and BL1, BLB1), the memory circuitry 202 includes other conductive lines including read select lines for every pair of bit lines (in this example, read select lines rsl0, rsl1 are shown since FIG. 2 only shows two pairs of bit lines BL0, BLB0 and BL1, BLB1), write select lines for every pair of bit lines (in this example, write select lines wsl0, wsl1 are shown since FIG. 2 only shows two pairs of bit lines BL0, BLB0 and BL1, BLB1), a pair of global read data lines grl, grlb, a pair of global write data lines (gwl, gwlb), and a pair sense of amplifier input lines (sil, silb).

To perform a read operation or a write operation on a particular memory cell, the multiplexer 204 is configured to select a one of the pair of bit lines having a column of memory cells that includes the particular memory cell for the read operation or the write operation. The multiplexer 204 is configured to unselect every other pair of bit lines having columns of memory cells that do not include the particular memory cell for the read operation or the write operation. In addition, the word line connected to a row of memory cells with the particular memory cell for the read operation or the write operation is asserted. Other words lines coupled to other rows of memory cells that do not include the particular memory cell for the read operation or the write operation remain unasserted.

For the sake of explanation, it is presumed that the memory cell 102 shown in FIG. 1 is the particular memory cell selected for a write operation. Furthermore, for the sake of explanation, it is further presumed that the pair of bit lines BL, BLB shown in FIG. 1 coupled to the memory cell 102 are the pair of bit lines BL0, BLB0 shown in FIG. 4. It should be noted however that the explanation of the write operation is analogous to a write operation for any one of the memory cells in the memory 104.

The precharging circuit 210(0) is coupled between the pair of bit lines BL0, BLB0 and the precharging circuit 210(1) is coupled between the pair of bit lines BL1, BLB1. Each of the precharging circuits 210 is controlled by a bit line precharge enable signal bl_pre. To begin the write operation, every bit line is precharged to a precharge state, wherein the precharge state in this example is at approximately the power rail voltage VDD. Thus, every bit line is precharged to a logic 1 to begin the write operation. In this example, the precharging circuit 210(0) is configured to precharge each of the bit lines, BL0, BLB0 to the precharge state. The precharging circuit 210(1) is configured to precharge each of the bit lines, BL1, BLB1 to the precharge state. The precharging circuits 210(0), 210(1) are then turned off.

The write driver 206 is configured to drive the pair of bit lines selected by the multiplexer 204 to voltages corresponding the logical states to be written into the memory cell (e.g., the memory cell 102 in this example). Furthermore, the write driver 206 is configured to provide a write assist that is sufficient to force the memory cell 102 to flip its logic states despite the voltage drop of the non-zero bit line, as explained in further detail below. In this regard, the write driver 206 is configured to receive the power rail voltage VDD, the grounded rail voltage GND, and complementary global write data signals, gdin, gdin_n. During the write operation, the write driver 206 is configured to generate the write data input signals, wdin, wdin_n based on the global write data signals gdin, gdin_n. In this example, the write data input signal wdin has a logical state that is the complement of the logical state of the global write data signal gdin. The write data input signal wdin is output by the write driver 206 along the global write data line gwl. The write data input signal wdin_n has a logical state that is the complement of the logical state of the global write data signal gdin_n. The write data input signal wdin_n is output by the write driver 206 along the global write data line gwlb. Thus, one of the write data input signals wdin, wdin_n is provided at approximately the ground rail voltage GND (at the logical state of logic 0) and the other one of the write data input signals wdin, wdin_n is provided at approximately the power rail voltage VDD (at the logical state of logic 1) depending the logical state being written into the bit cell. However, as explained above, simply providing the write data input signals wdin, wdin_n at the power rail voltage VDD and the ground rail voltage GND may be insufficient to write the appropriate differential logical states into the memory cell 102 due to the droop in the non-zero bit line. The write driver 206 is thus configured to provide a write assist as explained below.

Given the exemplary write operation and implementation discussed above, the word line WL coupled to the memory cell 102 may then be asserted and the multiplexer 204 is configured to select the pair of bit lines BL0, BLB0. The multiplexer 204 is configured to select the pair of bit lines BL0, BLB0 coupled to the memory cell 102 during the write operation. The multiplexer 204 also is configured to unselect all the other pair of bit lines during the write operation. Accordingly, the multiplexer 204 is configured to unselect the pair of bit lines BL1, BLB1. Furthermore, the word line WL shown in FIG. 1 is asserted during the write operation.

Accordingly, the bit line BL0, BLB0 that is the zero bit line begins to discharge through the multiplexer 204 in order to drive the bit lines BL0, BLB0 to the differential logical states to be written into the memory cell 102. For example, if the write data input signal wdin is output at logical 0 along the global write data line gwl and the write data input signal wdin_n is output at logical 1 along the global write data line gwlb, then the zero bit line is the bit line BL0 and the non-zero bit line is the bit line BLB0. On the other hand, if the write data input signal wdin is output at logical 1 along the global write data line gwl and the write data input signal wdin_n is output at logical 0 along the global write data line gwlb, then the zero bit line is the bit line BLB0 and the non-zero bit line is the bit line BL0.

As shown in FIG. 2, the multiplexer 204 includes a pair of write pass NFETs wp0, wpb0 and a pair of read pass PFETs rp0, rpb0 for the pair of bit lines BL0, BLB0. The gates of each of the write pass NFETs wp0, wpb0 are both coupled to the write select line wsl0. Thus, the gates of each of write pass NFETs wp0, wpb0 both receive a write select signal wm0 that is transmitted along the write select line wsl0. A source of the write pass NFET wp0 is coupled to the global write data line gwl and a source of the write pass NFET wpb0 is coupled to the global write data line gwlb. In addition, a drain of the write pass NFET wp0 is coupled to the bit line BL0 and a drain of the write pass NFET wpb0 is coupled to the bit line BLB0.

The gates of each of read pass PFETs rp0, rpb0 are both coupled to the read select line rsl0. Thus, the gates of each of read pass PFETs rp0, rpb0 both receive a read select signal rm0 that is transmitted along the read select line rsl0. A drain of the read pass PFET rp0 is coupled to the global read data line grl and a drain of the read pass PFET rpb0 is coupled to the global read data line grlb. The drain of the read pass PFET rp0 is also coupled to the sense amplifier input line sil while the drain of the read pass PFET rpb0 is also coupled to the sense amplifier input line silb. Furthermore, a source of the read pass PFET rp0 is coupled to the bit line BL0 and a source of the read pass PFET rpb0 is coupled to the bit line BLB0.

With regards to the bit line BL1, BLB1, the multiplexer 204 includes a pair of write pass NFETs wp1, wpb1 and a pair of read pass PFETs rp1, rpb1. The gates of each of write pass NFETs wp1, wpb1 are both coupled to the write select line wsl1. Thus, the gates of each of write pass NFETs wp1, wpb1 both receive a write select signal wm1 that is transmitted along the write select line wsl1. A source of the write pass NFET wp1 is coupled to the global write data line gwl and a source of the write pass NFET wpb1 is coupled to the global write data line gwlb. In addition, a drain of the write pass NFET wp1 is coupled to the bit line BL1 and a drain of the write pass NFET wpb1 is coupled to the bit line BLB1.

The gates of each of read pass PFETs rp1, rpb1 are both coupled to the read select line rsl1. Thus, the gates of each of read pass PFETs rp1, rpb1 both receive a read select signal rm1 that is transmitted along the read select line rsl1. A drain of the read pass PFET rp1 is coupled to the global read data line grl and a drain of the read pass PFET rpb1 is coupled to the global read data line grlb. The drain of the read pass PFET rp1 is also coupled to the sense amplifier input line sil while the drain of the read pass PFET rpb1 is coupled to the sense amplifier input line silb. A source of the read pass PFET rp1 is coupled to the bit line BL1 and a source of the read pass PFET rpb1 is coupled to the bit line BLB1. It should be noted that the pattern of pairs of read pass PFETs and write pass NFETs may be followed for every pair of bit lines in the memory 104.

In this example, all of the read select signals are provided at the power rail voltage VDD during the write operation and thus all of the read select lines are asserted. For example, both of the read select signals rm0, rm1 are provided at approximately the power rail voltage VDD during the write operation. Thus, the read pass PFETs rp0, rpb0, rp1, rpb1 are all turned off during the write operation.

Additionally, the write select signal for the pair of bit lines with the memory cell to be selected for the write operation is provided at approximately the power rail voltage VDD during the write operation while the write select signals for the remainder of the pairs of bit lines are provided approximately at the ground rail voltage GND. With regards to the exemplary write operation described above, the write select signal wm0 is provided at approximately the power rail voltage VDD while the remainder of the write select signals, including the write select signal wm1, are provided at approximately the ground rail voltage GND. Thus, the write select line wsl0 is asserted and the remainder of the write select lines, including the write select line wsl1, are unasserted during the write operation.

In response, the multiplexer 204 is configured to turn on the pair of write pass NFETs wp0, wpb0 coupled to the pair of bit lines BL0, BLB0 while the remainder of the pairs of write pass NFETs coupled to the other pairs of bit lines (including the pair of write pass NFETs wp1, wpb1) remain off. The write driver 206 is thus configured to apply the power rail voltage VDD to the source of one of the write pass NFETs wp0, wpb0 and the ground rail voltage GND to the source of the other one of the write pass NFETs wp0, wpb0 in accordance with the logical states of the write data input signals wdin, wdin_n transmitted along the global write data lines gwl, gwlb.

Accordingly, the bit line BL0, BLB0 that is coupled to the write pass NFET wp0, wpb0 with the source driven low to the ground rail voltage GND is the zero bit line while the bit line BL0, BLB0 with the source that is driven high to the power rail voltage VDD is the non-zero bit line during the write operation. Accordingly, the write pass NFET wp0, wpb0 being driven towards the ground rail voltage GND is configured to drive the zero bit line toward the ground rail voltage GND so that the zero bit line is discharged. However, since the source of the other write pass NFET wp0, wpb0 is driven to approximately the power rail voltage VDD, the write pass NFET wp0, wpb0 coupled to the non-zero bit line cannot drive the non-zero bit line.

Thus, the voltage of the non-zero bit line begins to drop significantly until the voltage drop of the non-zero bit line causes the write pass NFET wp0, wpb0 coupled to the non-zero bit line to enter an triode mode of operation. As a result, the voltage of the non-zero bit line can drop to the power rail voltage VDD minus the threshold voltage of the write pass NFET wp0, wpb0 coupled to the non-zero bit line. As explained above, this may result in the memory cell 102 entering a shadow read mode. Accordingly, simply providing one of the global write data lines gwl, gwlb at approximately the ground rail voltage GND and the other one of the global write data lines gwl, gwlb at approximately the power rail voltage VDD may not be sufficient to flip the logic states at the output storage nodes 118, 120 and complete the write operation. Accordingly, the write driver 206 is configured to provide a write assist.

To provide the write assist, the write driver 206 shown in FIG. 2 is configured to generate a negative boost voltage NBV along the one of the global write data lines gwl, gwlb connected to non-zero bit line. The negative boost voltage NBV is thus negative so as to be below the ground rail voltage GND. Thus, the source of the write pass NFET wp0, wpb0 connected to the zero bit line is driven toward the negative boost voltage NBV. As a result, the zero bit line is driven through the corresponding write pass NFET wp0, wpb0 toward the negative boost voltage NBV. The negative boost voltage NBV thereby increases a voltage difference between the zero bit line and the non-zero bit line. The magnitude of the negative boost voltage NBV is large enough so that the voltage difference between the zero bit line and the non-zero bit line can flip the logical states at the output storage nodes 118, 120 of the memory cell 102.

For example, when the write driver 206 generates the write data input signal wdin at approximately the power rail voltage VDD and the write data input signal wdin_n at the ground rail voltage GND, the source of the write pass NFET wp0 is provided at approximately the power rail voltage VDD and the source of the write pass NFET wpb0 is provided at approximately the ground rail voltage GND. Thus, the bit line BL0 is the non-zero bit line and the bit line BLB0 is the zero-bit line. The write pass NFET wpb0 thus drives the bit line BLB0 toward the ground rail voltage GND. However, the write pass NFET wp0 cannot drive the bit line BL0 to the power rail voltage VDD and the voltage of the bit line BL0 may drop until the write pass NFET wp0 enters the triode mode of operation. The write driver 206 is thus configured to apply the negative boost voltage NBV along the global write data line gwlb, which drives the source of the write pass NFET wp0 toward the negative boost voltage NBV. As a result, the write pass NFET wpb0 drives the bit line BLB0 to the negative boost voltage NBV. The voltage difference between the bit line BL0, BLB0 is thus sufficient so that the memory cell 102 flips the logical states of the bit q from logic 0 to logic 1 and the bit qb from logic 1 to logic 0.

Throughout the write operation, a global sense enable signal sen_global and a precharge enable signal sen_pre are both provided at approximately the power rail voltage VDD. The global sense enable signal sen_global is received by the inverter gate 212 while the precharge enable signal sen_pre is received by the inverter gate 214. The inverter gate 212 is configured to generate a control voltage iso, which is a complement of the global sense enable signal sen_global. Additionally, the inverter gate 214 is configured to generate a complementary precharge enable signal sen_pre_n. Thus, throughout the write operation, the control voltage iso and the precharge enable signal sen_pre_n are provided at approximately the ground rail voltage GND.

The gates of the isolation PFETs 216 receive the control voltage iso while the precharging circuit 208 receives the precharge enable signal sen_pre_n. Thus, the isolation PFETs 216 are turned on and the precharging circuit 208 is turned on throughout the write operation. As a result, the sense amplifier input lines sil, silb are both driven to the precharge state at approximately the power rail voltage VDD. A sense amplifier (SA) may hold the read bits in response to both of the sense amplifier input lines sil, silb being at the power rail voltage VDD, which correspond to the read input logical states both being at logic 1. Furthermore, while the sense amplifier input lines sil, silb are coupled to the drains of the read pass PFET rp0, rpb0, the precharging of the sense amplifier input lines sil, silb do not affect the write operation since all of the read pass PFETs, including the read pass PFET rp0, rpb0 are turned off.

A boost capacitance may be provided in the write driver 206 to generate the negative voltage boost NBV. To correct the write degradation caused by the voltage drop of the non-zero bit line, the voltage magnitude of the negative voltage boost NBV should be large enough to cause the memory cell 102 to flip the stored logical states. Accordingly, the boost capacitance has to be large enough to provide this negative voltage boost NBV. However, as device sizes shrink and resistances of bit lines and memory cells increase, the size of the boost capacitance needed to correct write degradation increases. This thus may require larger boost capacitances which may consume larger amounts of area and power in the IC.

Figure 3:
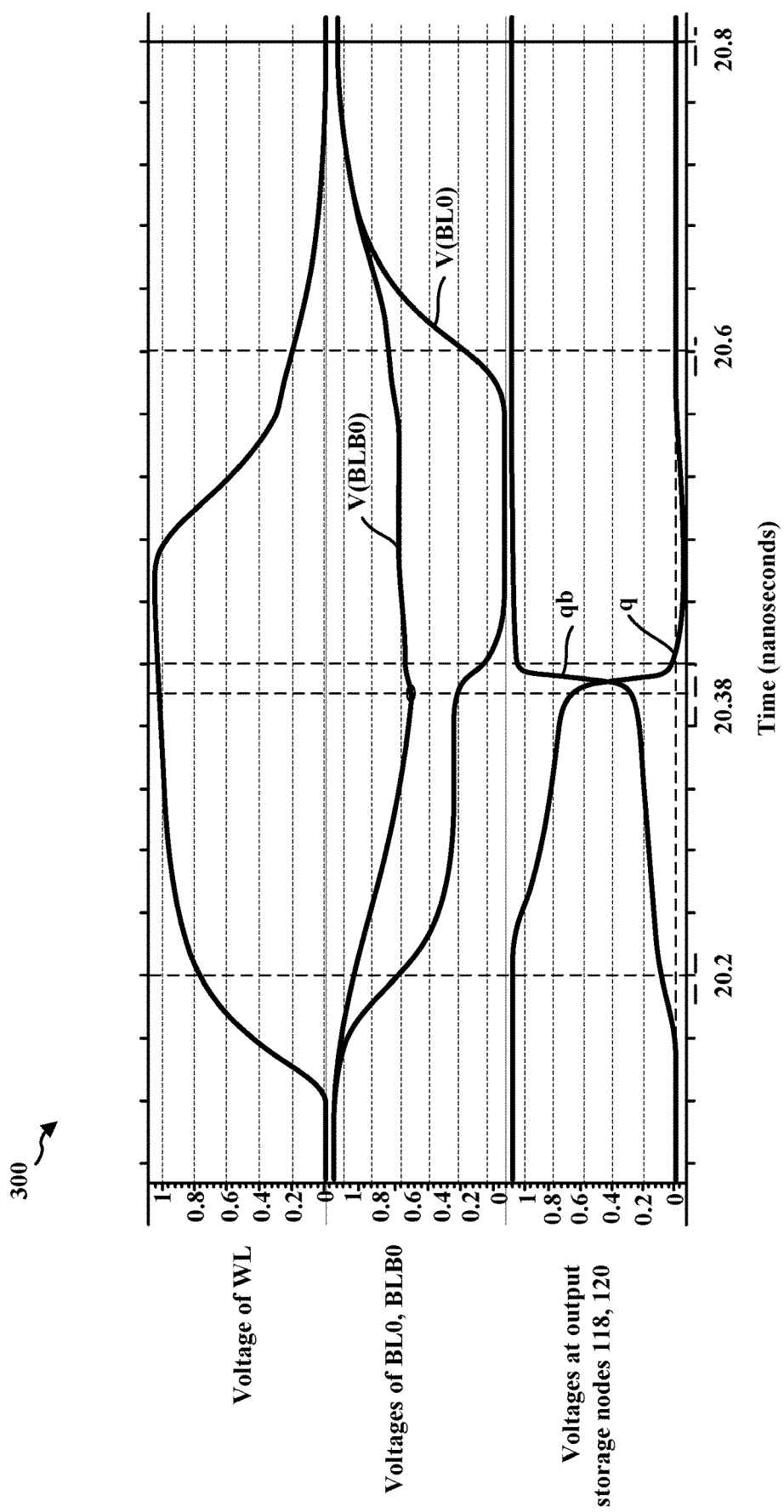
FIG. 3 is an exemplary signal diagram for the memory circuitry shown in FIG. 2 during an exemplary write operation.

FIG. 3 is a signal diagram 300 for an exemplary write operation provided by the memory 104 when the memory cell 102 is coupled to the pair of bit lines BL0, BLB0 of the memory circuitry 202 shown in FIG. 2, when the power rail voltage VDD is equal to 1.082V, and when the memory 104 is SRAM formed in a CMOS IC having a feature size of 14 nm. In this example, the stored bits q, qb are being changed from differential logical states of logic 1, logic 0 respectively to differential logical states of logic 0, logic 1, respectively. As shown in FIG. 3, the bit lines BL0, BLB0 have been precharged at the beginning of the write operation to approximately the power rail voltage VDD. A voltage of the word line WL is then driven toward the power rail voltage VDD and the multiplexer 204 selects the pair of bit lines BL0, BLB0. The write driver 206 then begins to drive the bit line BL0 toward the ground rail voltage GND at 0V and thus the bit line BL0 in this example is the zero bit line and the bit line BLB0 is the non-zero bit line. Once the voltage on the word line WL is sufficient to turn on the access NFETs 126, 128, the voltage of the bit line BL0 begins driving the output storage node 118 that stores the bit q towards the ground rail voltage GND. Additionally, the voltage of the bit line BLB0 (i.e., the non-zero bit line in this example) also begins to drive the output storage node 120 that stores the bit qb toward the power rail voltage VDD. However, as shown in FIG. 3, the voltage of the bit line BLB0 (i.e., the zero bit line in this example) begins to droop and the feedback of the memory cell 102 prevents the bit line BL0 from reaching the ground rail voltage GND of 0V. As such, the voltage at the output storage node 118 that stores the bit q is prevented from reaching the ground rail voltage GND and the voltage at the storage node that stores the bit qb is prevented from reaching approximately the power rail voltage VDD. In this example, the voltage of the bit line BLB0 drop 540 mV, which is large in comparison to the power rail voltage VDD at 1.082V. Thus, due to the droop the voltage of the bit line BLB0 is provided at 539 mV due to the droop. The bit line BL0 also stops being discharged at around 212 mV. A voltage difference of 327 mV may be insufficient to flip the logical states of the bit q, qb.

As the time indicated by the dashed line, the write driver 206 is configured to apply the negative boost voltage NBV (in this example, −200 mV) to the global write data line gwl so that the bit line BL0 (i.e., the zero bit line in this example) is driven toward the negative boost voltage NBV. As such, the voltage difference between the bit lines BL0, BLB0 is sufficient to overcome the feedback of the memory cell 102. The voltage difference thereby drives the output storage node 118 that stores bit q to approximately the ground rail voltage GND (which corresponds to logic 0) and drives the output storage node 120 that stores the bit qb to approximately the power rail voltage VDD (which corresponds to logic 1) so as to flip the logical states of the stored bits q, qb.

However, some implementations of the memory circuitry 202 may not be suitable or desirable in certain applications. For instance, when feature sizes are smaller than 14 nm in the SRAM, the boost capacitance needed to overcome the voltage drop of 539 mV (given the resistances of the SRAM) may simply consume too much area and power to be acceptable in certain applications.

Figure 4:
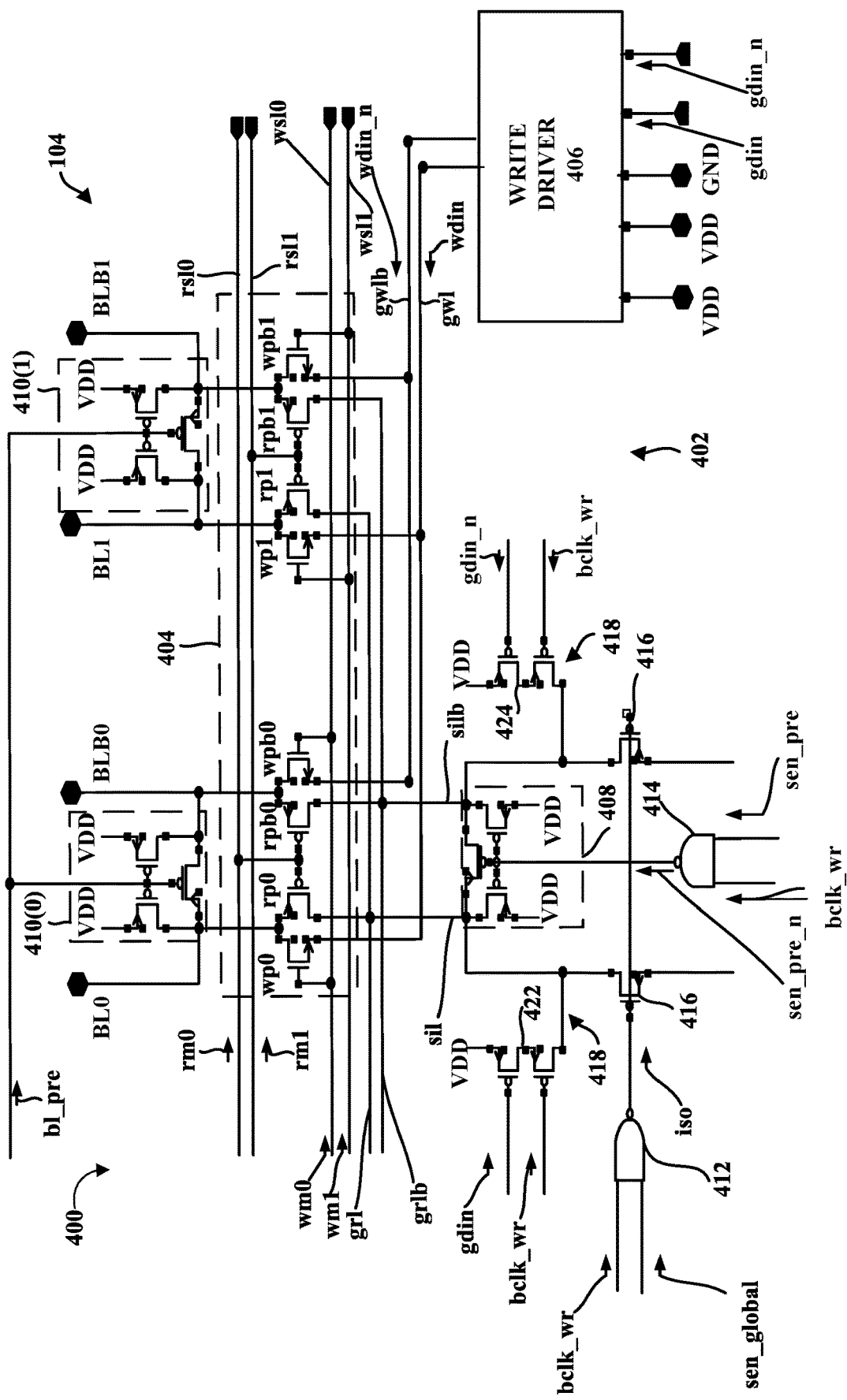
FIG. 4 is circuit diagram of memory circuitry that may be used during a write operation to write to the memory cell shown in FIG. 1.

FIG. 4 illustrates a circuit diagram 400 of memory circuitry 402 which may be provided as part of the memory 104 instead of the memory circuitry 202 shown in FIG. 2. The memory circuitry 402 is also operable to provide a write assist that increases the voltage difference between the bit lines BL, BLB so that the voltage difference is sufficient to flip the logical states of the stored bits q, qb at the output storage nodes 118, 120 during a write operation. However, the memory circuitry 402 shown in FIG. 4 is capable of overcoming the feedback of the memory cell 102 with smaller boost capacitances than the memory circuitry 202 shown in FIG. 2. In some implementations, a boost capacitance may not be required at all.

The memory circuitry 402 includes the plurality of pairs of bit lines. For the sake of simplicity, the memory circuitry 402 is shown with the two pairs of bit lines (the pair of bit lines BL0, BLB0 and the pair of bit lines BL1, BLB1). It should be noted that the memory circuitry 402 may include any number of pairs of bit lines depending on the storage capabilities and topology of the memory 104. As explained above, at least one array of memory cells may be provided in the memory 104. Each of the memory cells may be identical to the memory cell 102 shown in FIG. 1. A column of the memory cells is coupled between each pair of bit lines. Thus, a column of the memory cells is coupled between the pair of bit lines BL0, BLB0. Additionally, a column of the memory cells is coupled between the pair of bit lines BL1, BLB1. Rows of the memory cells are also provided in the memory 104 and word lines are provided to select the rows of memory cells. More specifically, each row of the memory cells may be connected to one of the word lines. For example, the row of memory cells that include the memory cell 102 shown in FIG. 1 are all coupled to the word line WL.

The memory circuitry 402 shown in FIG. 4 includes a multiplexer 404, a write driver 406, precharging circuit 408, precharging circuit 410(0), precharging circuit 410(1), a NAND gate 412, a NAND gate 414, a pair of isolation PFETs 416, and a pull-up circuit 418. In addition to the pairs of bit lines (e.g., BL0, BLB0 and BL1, BLB1), the memory circuitry 402 includes other conductive lines including the read select lines for every pair of bit lines (in this example, read select lines rsl0, rsl1 are shown since FIG. 4 only shows two pairs of bit lines BL0, BLB0 and BL1, BLB1), the write select lines for every pair of bit lines (in this example, write select lines wsl0, wsl1 are shown since FIG. 4 only shows two pairs of bit lines BL0, BLB0 and BL1, BLB1), the pair of global read data lines grl, grlb, the pair of global write data lines (gwl, gwlb), and the pair of sense amplifier input lines (sil, silb).

To perform a read operation or a write operation on a particular memory cell, the multiplexer 404 is configured to select a one of the pair of bit lines having a column of memory cells that includes the particular memory cell for the read operation or the write operation. The multiplexer 404 is configured to unselect every other pair of bit lines having columns of memory cells that do not include the particular memory cell for the read operation or the write operation. In addition, the word line connected to a row of memory cells with the particular memory cell for the read operation or the write operation is asserted. Other words lines coupled to other rows of memory cells that do not include the particular memory cell for the read operation or the write operation remain unasserted.

For the sake of explanation, it is presumed that the memory cell 102 shown in FIG. 1 is the particular memory cell selected for a write operation. Furthermore, for the sake of explanation, it is further presumed that the pair of bit lines BL, BLB shown in FIG. 1 coupled to the memory cell 102 are the pair of bit lines BL0, BLB0 shown in FIG. 4. It should be noted however that the explanation of the write operation is analogous to a write operation for any one of the memory cells in the memory 104.

The precharging circuit 410(0) is coupled between the pair of bit lines BL0, BLB0 and the precharging circuit 410(1) is coupled between the pair of bit lines BL1, BLB1. Each of the precharging circuits 410(0), 410(1) is controlled by a bit line precharge enable signal bl_pre. To begin the write operation, every bit line is precharged to a precharge state, wherein the precharge state in this example is approximately the power rail voltage VDD. Thus, every bit line is precharged to a logic 1 to begin the write operation. In this example, the precharging circuit 410(0) is configured to precharge each of the bit lines, BL0, BLB0 to the precharge state at approximately the power rail voltage VDD. The precharging circuit 410(1) is configured to precharge each of the bit lines, BL1, BLB1 to the precharge state. The precharging circuits 410(0), 410(1) are then turned off by the bit line precharge enable signal bl_pre.

The write driver 406 is configured to drive the pair of bit lines selected by the multiplexer 404 to voltages corresponding the logical states to be written into the memory cell (e.g., the memory cell 102 in the exemplary write operation). Furthermore, the write driver 406 may be configured to provide a write assist that is sufficient to force the memory cell 102 to flip its logic states, as explained in further detail below. However, the memory circuitry 402 shown in FIG. 4 does not require large boost capacitances in order to write to the memory cell 102.

The write driver 406 is configured to receive the power rail voltage VDD, the ground rail voltage GND, and the complementary global write data signals, gdin, gdin_n. During the write operation, the write driver 406 is configured to generate complementary write data input signals, wdin, wdin_n based on the complementary global write data signals gdin, gdin_n. In this example, the write data input signal wdin has a logical state that is the complement of the logical state of the global write data signal gdin. The write data input signal wdin is output by the write driver 406 along the global write data line gwl. The write data input signal wdin_n has a logical state that is the complement of the logical state of the global write data signal gdin_n. The write data input signal wdin_n is output by the write driver 406 along the global write data line gwlb. Thus, one of the write data input signals wdin, wdin_n is provided at approximately the ground rail voltage GND (which corresponds to the logical state of logic 0) and the other one of the write data input signals wdin, wdin_n is provided at approximately the power rail voltage VDD (which corresponds to the logical state of logic 1) depending on the logical states being written into the bit cell.

To select the memory cell 102 for the write operation, the word line WL coupled to the memory cell 102 may then be asserted and the multiplexer 404 is configured to select the pair of bit lines BL0, BLB0, which are coupled to the memory cell 102. Given the described exemplary write operation and implementation discussed above, the multiplexer 404 is configured to select the pair of bit lines BL0, BLB0 are coupled to the memory cell 102 during the write operation. The multiplexer 404 also is configured to unselect all the other pair of bit lines during the write operation. Thus, the multiplexer 404 is configured to unselect the pair of bit lines BL1, BLB1 in the described exemplary write operation. Furthermore, the word line WL shown in FIG. 1 is asserted during the write operation.

Accordingly, the bit line BL0, BLB0 that is the zero bit line begins to discharge through the multiplexer 404 in order to drive the bit lines BL0, BLB0 to the differential logical states of the write data to be written into the memory cell 102. For example, if the write data input signal wdin is output at logical 0 along the global write data line gwl and the write data input signal wdin_n is output at logical 1 along the global write data line gwlb, then the zero bit line is the bit line BL0 and the non-zero bit line is the bit line BLB0. On the other hand, if the write data input signal wdin is output at logical 1 along the global write data line gwl and the write data input signal wdin_n is output at logical 0 along the global write data line gwlb, then the zero bit line is the bit line BLB0 and the non-zero bit line is the bit line BL0.

As shown in FIG. 4, the multiplexer 404 includes a pair of write pass NFETs wp0, wpb0 and a pair of read pass PFETs rp0, rpb0 for the pair of bit lines BL0, BLB0. The gates of each of write pass NFETs wp0, wpb0 are both coupled to the write select line wsl0. Thus, the gates of each of write pass NFETs wp0, wpb0 both receive a write select signal wm0 that is transmitted along the write select line wsl0. A source of the write pass NFET wp0 is coupled to the global write data line gwl and a source of the write pass NFET wpb0 is coupled to the global write data line gwlb. A drain of the write pass NFET wp0 is coupled to the bit line BL0 and a drain of the write pass NFET wpb0 is coupled to the bit line BLB0.

The gates of each of read pass PFETs rp0, rpb0 are both coupled to the read select line rsl0. Thus, the gates of each of read pass PFETs rp0, rpb0 both receive a read select signal rm0 that is transmitted along the read select line rsl0. A drain of the read pass PFET rp0 is coupled to the global read data line grl and a drain of the read pass PFET rpb0 is coupled to the global read data line grlb. The drain of the read pass PFET rp0 is also coupled to the sense amplifier input line sil and the drain of the read pass PFET rpb0 is also coupled to the sense amplifier input line silb. A source of the read pass PFET rp0 is coupled to the bit line BL0 and a source of the read pass PFET rpb0 is coupled to the bit line BLB0.

Furthermore, the multiplexer 404 includes a pair of write pass NFETs wp1, wpb1 and a pair of read pass PFETs rp1, rpb1 for the pair of bit lines BL1, BLB1. The gates of each of write pass NFETs wp1, wpb1 are both coupled to the write select line wsl1. Thus, the gates of each of write pass NFETs wp1, wpb1 both receive a write select signal wm1 that is transmitted along the write select line wsl1. A source of the write pass NFET wp1 is coupled to the global write data line gwl and a source of the write pass NFET wpb1 is coupled to the global write data line gwlb. A drain of the write pass NFET wp1 is coupled to the bit line BL1 and a drain of the write pass NFET wpb1 is coupled to the bit line BLB1.

The gates of each of read pass PFETs rp1, rpb1 are both coupled to the read select line rsl1. Thus, the gates of each of read pass PFETs rp1, rpb1 both receive a read select signal rm1 that is transmitted along the read select line rsl1. A drain of the read pass PFET rp1 is coupled to the global read data line grl and a drain of the read pass PFET rpb1 is coupled to the global read data line grlb. The drain of the read pass PFET rp1 is also coupled to the sense amplifier input line sil and the drain of the read pass PFET rpb1 is also coupled to the sense amplifier input line silb. A source of the read pass PFET rp1 is coupled to the bit line BL1 and a source of the read pass PFET rpb1 is coupled to the bit line BLB1. It should be noted that the pattern of pairs of read pass PFETs and write pass NFETs may be followed for every pair of bit lines in the memory 104.

In FIG. 4, the read select signal for the pair of bit lines with the memory cell to be selected for the write operation is provided at approximately the ground rail voltage GND during the write operation while the read select signal for the remainder of the pairs of bit lines are provided approximately at the power rail voltage VDD. With regards to the exemplary write operation described above, the read select signal rm0 is provided at approximately the ground rail voltage GND while the remainder of the read select signals, including the read select signal rm1, are provided at approximately the power rail voltage VDD. Thus, the read select line rsl0 is configured to be unasserted when the pair of bit lines BL0, BLB0 are selected for the write operation. Since the gates of the pair of read pass PFETs rp0, rpb0 are coupled to the read select line rm0, the pair of read pass PFETs rp0, rpb0 are turned on when the read select line rsl0 is unasserted.

Additionally, the write select signal for the pair of bit lines with the memory cell to be selected for the write operation is provided at approximately the power rail voltage VDD during the write operation while the write select signal for the remainder of the pairs of bit lines are provided approximately at the ground rail voltage GND. With regards to the exemplary write operation described above, the write select signal wm0 is provided at approximately the power rail voltage VDD while the remainder of the write select signals, including the write select signal wm1, are provided at approximately the ground rail voltage GND. Thus, the write select line wsl0 is configured to be asserted when the pair of bit lines BL0, BLB0 are selected for the write operation. Since the gates of the pair of write pass PFETs wp0, wpb0 are coupled to the write select line wm0, the pair of write pass PFETs wp0, wpb0 are turned on when the write select line wsl0 is asserted.

Unlike the embodiment shown in FIG. 2, the multiplexer 404 shown in FIG. 4 is therefore configured to select the pair of bit lines during the write operation by turning on the pair of write pass NFETs and turning on the pair of read pass PFETs coupled to the selected memory cell. Continuing with the exemplary write operation described above, the multiplexer 404 is configured to turn on the pair of write pass NFETs wp0, wpb0 coupled to the pair of bit lines BL0, BLB0 while the remainder of the pairs of write pass NFETs coupled to the other pairs of bit lines (including the pair of write pass NFETs wp1, wpb1) remain off. Additionally, the multiplexer 404 is configured to turn on the pair of read pass PFETs rp0, rpb0 coupled to the pair of bit lines BL0, BLB0 while the remainder of the pairs of read pass PFETs coupled to the other pairs of bit lines (including the pair of read pass PFETs rp1, rpb1) remain off.

The write driver 406 is configured to apply the power rail voltage VDD to the source of one of the write pass NFETs wp0, wpb0 and the ground rail voltage GND to the source of the other one of the write pass NFETs wp0, wpb0 in accordance with the logical states of the write data input signals wdin, wdin_n provided along the global write data lines gwl, gwlb.

Accordingly, the bit line BL0, BLB0 that is coupled to the write pass NFET wp0, wpb0 with the source that is driven low to the ground rail voltage GND is the zero bit line while the bit line BL0, BLB0 with the source that is driven high to the power rail voltage VDD is the non-zero bit line during the write operation. Accordingly, the write pass NFET wp0, wpb0 with the source driven to the ground rail voltage GND is configured to drive the zero bit line toward the ground rail voltage GND and thus the zero bit line is discharged. However, since the source of the other write pass NFET wp0, wpb0 is driven to approximately the power rail voltage VDD, the write pass NFET wp0, wpb0 coupled to the non-zero bit line cannot drive the non-zero bit line.

However, this is at least partially corrected by using the pull-up circuit 418. The pull-up circuit 418 is coupled to the multiplexer 404. Furthermore, the pull-up circuit 418 is configured to select which of the selected pair of bit lines is the non-zero bit line during the write operation and to clamp the non-zero bit line through the multiplexer 404 to approximately the power rail voltage VDD. With regard to the exemplary write operation described above, the pull-up circuit 418 is configured to select which of the pair of bit lines BL0, BLB0 is the non-zero bit line by selecting the read pass PFET rp0, rpb0 that is coupled to the non-zero bit line. The pull-up circuit 418 is configured to clamp the non-zero bit line to approximately the power rail voltage VDD through the selected read pass PFET rp0, rpb0 that is coupled to the non-zero bit line. This is possible since the pair of read pass PFETs rp0, rpb0 are turned on during the write operation.

As shown in FIG. 4, the pull-up circuit 418 has a stack of pull-up PFETs 422 directly connected to the sense amplifier input line sil and a stack of pull-up PFETs 424 directly connected to the sense amplifier input line silb. More specifically, a source of a top pull-up PFET in the stack of pull-up PFETs 422 is configured to receive the power rail voltage VDD and a drain of a bottom pull-up PFET in the stack of pull-up PFETs 422 is directly connected to the sense amplifier input line sil between the multiplexer 404 and a drain of one of the isolation PFETs 416. The drain of the top pull-up PFET and a source of the bottom pull-up PFET are directly connected to one another in the stack of pull-up PFETs 422.

In addition, a source of a top pull-up PFET in the stack of pull-up PFETs 424 is configured to receive the power rail voltage VDD and a drain of a bottom pull-up PFET in the stack of pull-up PFETs 424 is directly connected to the sense amplifier input line silb between the multiplexer 404 and a drain of the other isolation PFETs 416. The drain of the top pull-up PFET and a source of the bottom pull-up PFET are directly connected to one another in the stack of pull-up PFETs 424.

The stack of pull-up PFETs 422 is thus connected to the drain of one of the read pass PFETs and the stack of pull-up PFETs 424 is thus connected to the drain of the other read pass PFET of every pair of PFETs in the multiplexer 404. For example, the stack of pull-up PFETs 422 is connected to the drain of the read pass PFET rp0 coupled to the bit line BL0 and the stack of pull-up PFETs 424 is connected to the drain of the read pass PFET rpb0 coupled to the bit line BLB0.

The pull-up circuit 418 is configured to select which of the pair of bit lines BL0, BLB0 is the non-zero bit line by selecting the sense amplifier input line of the sense amplifier input lines sil, silb coupled to the non-zero bit line. More specifically, the pull-up circuit 418 is configured to turn on either the stack of pull-up PFETs 422 or the stack of pull-up PFETs 424 depending on which of the read pass PFET rp0, rpb0 is coupled to the non-zero bit line. The other stack of pull-up PFETs 422, 424 that is coupled to the zero bit line remains off. In this manner, the pull-up circuit 418 is configured to select which of the sense amplifier input lines sil, silb is coupled to the non-zero bit line. Whichever stack of pull-up PFETs 422, 424 is turned on is thus configured to pull-up the sense amplifier input line sil, silb that is coupled to the non-zero bit line and charge the non-zero bit line to approximately the power rail voltage VDD through whichever one of the read pass PFETs rp0, rpb0 is coupled to the non-zero bit line. For example, if the non-zero bit line is the bit line BL0, the pull-up circuit 418 is configured to turn on the stack of pull-up PFETs 422 and to turn off the stack of pull-up PFETs 424. On the other hand, if the non-zero bit line is the bit line BLB0, the pull-up circuit 418 is configured to turn on the stack of pull-up PFETs 424 and to turn off the stack of pull-up PFETs 422.

For read operations, the sense amplifier input lines sil, silb are coupled to the pairs of bit lines, including the bit lines BL0, BLB0, BL1, BL1, through the pairs of read pass PFETs in the multiplexer 404 so that a pair of bit lines can be selected during read operations by turning on the corresponding pair of read pass PFETs in the multiplexer 404. When the isolation PFETs 416 are turned on, the sense amplifier can read the logical states through the sense amplifier input line sil, silb. The pull-up circuit 418 should thus be operated so as to not interfere with the read operations.

As shown in FIG. 4, the top pull-up PFET in the stack of pull-up PFETs 422 has a gate configured to receive a write clock signal bclk_wr. Similarly, the top pull-up PFET in the stack of pull-up PFETs 424 also has a gate configured to receive the write clock signal bclk_wr. The write clock signal bclk_wr is provided at logic 0 during the write operation but is otherwise at logic 1. Accordingly, the top pull-up PFETs in both stacks of pull-up PFETs 422, 424 are turned on during the write operation but are otherwise turned off. In this manner, neither stack of pull-up PFETs 422, 424 can be turned on during read operations.

In the pull-up circuit 418 shown in FIG. 4, the bottom pull-up PFET in the stack of pull-up PFETs 422 has a gate configured to receive the global write data signal gdin while the bottom pull-up PFET in the stack of pull-up PFETs 424 has a gate configured to receive the global write data signal gdin_n. As mentioned above, the write driver 406 is configured to generate the write data input signal wdin along the global write data line gwl as the complement of the global write data signal gdin. The write driver 406 is also configured to generate the write data input signal wdin_n along the global write data line gwlb as the complement of the global write data signal gdin_n. Thus, if the global write data signal gdin is at logic 0 and the complementary global write logic signal gdin_n is at logic 1, the write driver 406 generates the write data input signal wdin at logic 1 and the write data input signal wdin_n at logic 0 during the write operation. With regard to the exemplary write operation discussed above, the bit line BL0 would be the non-zero bit line while the bit line BLB0 is the zero bit line. On the other hand, if the global write data signal gdin is at logic 1 and the complementary global write logic signal gdin_n is at logic 0, the write driver 406 generates the write data input signal wdin at logic 0 and the write data input signal wdin_n at logic 1 during the write operation. Thus, the bit line BLB0 would be the non-zero bit line while the bit line BL0 is the zero bit line.

The global write data line gwl is coupled to the sources of the write pass NFETs and the sense amplifier input line sil is coupled the drains of the read pass PFETs that are connected to the same bit line for every pair of bit lines. The global write data line gwlb is coupled to the sources of the write pass NFETs and the sense amplifier input line silb is coupled the drains of the read pass PFETs that are connected to the same bit line for every pair of bit lines. For example, the global write data line gwl is connected to the source of the write pass NFET wp0 and the sense amplifier input line sil is connected to the drain of the read pass PFET rp0, where the write pass NFET wp0 and the read pass PFET rp0 are both coupled to the bit line BL0. Similarly, the global write data line gwlb is connected to the source of the write pass NFET wpb0 and the sense amplifier input line silb is connected to the drain of the read pass PFET rpb0, where the write pass NFET wpb0 and the read pass PFET rpb0 are both coupled to the bit line BLB0.

Accordingly, whenever the global write data signal gdin is at logic 0 during a write operation, the non-zero bit line will be the bit line connected to the sense amplifier input line sil and the global write data line gwl. With regard to the exemplary write operation discussed above, if the global write data signal gdin is at logic 0 during the write operation, the non-zero bit line will be the bit line BL0 connected to the sense amplifier input line sil and the global write data line gwl (since the write data input signal wdin will be generated at logic 1 by the write driver 406). In this case, when the write clock signal bclk_wr is provided at logic 0 during the write operation, the stack of pull-up PFETs 422 is turned on since the global write data signal gdin is at logic 0. The stack of pull-up PFETs 422 thus pulls up the sense amplifier input line sil and thus also the drain of the read pass PFET rp0 to approximately the power rail voltage VDD. The stack of pull-up PFETs 424 is turned off since the global write data signal gdin_n is at logic 1.

Whenever the global write data signal gdin_n is at logic 0 during a write operation, the non-zero bit line will be the bit line connected to the sense amplifier input line silb and the global write data line gwlb. With regard to the exemplary write operation discussed above, if the global write data signal gdin_n is at logic 0 during the write operation, the non-zero bit line will be the bit line BLB0 connected to the sense amplifier input line silb and the global write data line gwlb (since the write data input signal wdin_n will be generated at logic 1 by the write driver 406). In this case, when the write clock signal bclk_wr is provided at logic 0 during the write operation, the stack of pull-up PFETs 424 is turned on since the global write data signal gdin_n is at logic 0. The stack of pull-up PFETs 424 thus pulls up the sense amplifier input line silb and thus also the drain of the read pass PFET rpb0 to approximately the power rail voltage VDD. The stack of pull-up PFETs 422 is turned off since the global write data signal gdin is at logic 1.

The write driver 406 shown in FIG. 4 may still be configured to generate a negative boost voltage NBV along the one of the global write data lines gwl, gwlb connected to non-zero bit line. As discussed above, the negative boost voltage NBV is negative so as to be below the ground rail voltage GND. Since the source of the write pass NFET wp0, wpb0 connected to the zero bit line is at approximately the negative boost voltage NBV, the zero bit line is driven through the corresponding write pass NFET wp0, wpb0 toward the negative boost voltage NBV. The negative boost voltage NBV thereby increases a voltage difference between the zero bit line and the non-zero bit line.

For example, when the write driver 406 generates the write data input signal wdin at approximately the power rail voltage VDD and the write data input signal wdin_n at the ground rail voltage GND, the source of the write pass NFET wp0 is provided at approximately the power rail voltage VDD and the source of the write pass NFET wpb0 is provided at approximately the ground rail voltage GND. Thus, the bit line BL0 is the non-zero bit line and the bit line BLB0 is the zero-bit line. In this case, the stack of pull-up PFETs 422 in the pull-up circuit 418 is turned on to pull up the drain of the read pass PFET rp0 and, thus, the bit line BL0 to approximately the power rail voltage VDD. The write pass NFET wpb0 thus discharges the bit line BLB0 toward the ground rail voltage GND. The write driver 406 is thus configured to apply the negative boost voltage NBV along the global write data line gwlb, which drives the source of the write pass NFET wpb0. Accordingly, the write pass NFET wpb0 drives the bit line BLB0 to the negative boost voltage NBV. The voltage difference between the bit line BL0, BLB0 is thus sufficient so that the memory cell 102 flips the logical states of the bit q from logic 0 to logic 1 and the bit qb from logic 1 to logic 0. However, since the stack of pull-up PFETs 422 clamped the bit line BL0 at approximately the power rail voltage VDD, the boost capacitance does not have to be so large. In fact, in some implementations, the write driver 406 may not provide a negative boost voltage NBV at all.

Reducing losses resulting from the boost capacitance may improve efficiency of an SRAM memory and produce higher yields. Additionally, reduction in boost generation may decrease the risk to device reliability caused by having higher boost generation and repetitive boost generation. Dynamic energy dissipation may also be decreased since less power is needed to provide the negative voltage boost NBV and perform the write operation.

As explained above, the read pass PFETs of the selected pair of bit lines are turned on during a write operation. Thus, the memory circuitry 402 shown in FIG. 4 should be operated to prevent the precharging circuit 408 coupled to the sense amplifier lines sil, silb from interfering with the write operation. Furthermore, since the pull-up circuit 418 affects the voltage at the sense amplifier input lines sil, silb, the isolation PFETs 416 should be operated to prevent false data reads by the sense amplifier.

As shown in FIG. 4, a drain of one of the isolation PFETs 416 is coupled to the sense amplifier input line sil and a drain of the other isolation PFET 416 is coupled to the sense amplifier input line silb. The sources of the isolation PFETs 416 may be coupled to different input terminals so that the sense amplifier can receive differential logic states along the sense amplifier lines sil, silb during a read operation when the isolation PFETs 416 are turned on. However, when the isolation PFETs 416 are turned off, the sense amplifier becomes opaque since the sense amplifier cannot receive the logical states along the sense amplifier input lines sil, silb.

The NAND gate 412 shown in FIG. 4 is configured to turn off the isolation PFETs 416 during the write operation and to turn on the isolation PFETs 416 during a read operation. The NAND gate 412 has an output coupled to each of the gates of the isolation PFETs 416. In this implementation, the NAND gate 412 has an input that receives the global sense enable signal sen_global and an input that receives the write clock signal bclk_wr. The NAND gate 412 is thus configured to perform a NAND operation between the write clock signal bclk_wr and the global sense enable signal sen_global so as to generate the control voltage iso at the output. Throughout the write operation, the global sense enable signal sen_global is provided at approximately the power rail voltage VDD, which corresponds to a logic 1. However, the write clock signal bclk_wr is provided at approximately the ground rail voltage GND during the write operation, which corresponds to logic 0. Thus, the NAND gate 412 is configured to generate the control voltage iso at logic 1 during the write operation. The control voltage iso thus pulls up each of the gates so as to turn off the isolation PFETs 416 during the write operation. Accordingly, the sense amplifier is isolated to prevent false read operations during the write operation.

However, the global sense enable signal sen_global is provided at approximately the power rail voltage VDD, which corresponds to a logic 1 during at least part of a read operation. Furthermore, the write clock signal bclk_wr is provided at approximately the power rail voltage VDD, which corresponds to a logic 1, when the write operation is not being performed. The NAND gate 412 is thus configured to pull down each of the gates of the isolation PFETs 416 so as to turn on each of the isolation PFETs 416 during the read operation. Thus, the NAND gate 412 is configured to generate the control voltage iso at logic 0 during the read operation and pull down each of the gates so as to turn on the isolation PFETs 416 during the read operation. Accordingly, the sense amplifier becomes transparent and can thus read the logical states from the sense amplifier input lines sil, silb.

The NAND gate 414 is provided so that the precharging circuit 408 does not affect the write operation but precharges the sense amplifier input lines sil, silb at the beginning of a read operation. The NAND gate 414 has an output coupled to the precharging circuit 408. In this implementation, the NAND gate 414 has an input that receives the precharge enable signal sen_pre and an input that receives the write clock signal bclk_wr. The NAND gate 414 is thus configured to perform a NAND operation between the write clock signal bclk_wr and the precharge enable signal sen_pre so as to generate the control voltage (i.e., precharge enable signal sen_pre_n) at the output. Throughout the write operation, the precharge enable signal sen_pre is provided at approximately the power rail voltage VDD, which corresponds to a logic 1. However, the write clock signal bclk_wr is provided at approximately the ground rail voltage GND during the write operation, which corresponds to logic 0. Thus, the NAND gate 414 is configured to generate the control voltage (i.e., precharge enable signal sen_pre_n) at logic 1 to turn off the precharging circuit 408 during the write operation. Accordingly, the precharging circuit 408 does not interfere with the write operation.

The precharge enable signal sen_pre is provided at approximately the power rail voltage VDD, which corresponds to a logic 1 at the beginning of the read operation. Furthermore, the write clock signal bclk_wr is provided at approximately the power rail voltage VDD, which corresponds to a logic 1 when the write operation is not being performed. Thus, the NAND gate 414 is configured to generate the control voltage (i.e., precharge enable signal sen_pre_n) at logic 0 during the beginning of the read operation so that the precharging circuit 408 precharges the sense amplifier input lines sil, silb. Thus, the NAND gate 414 is configured to turn off the precharging circuit 408 coupled to the sense amplifier input lines sil, silb during the write operation and to turn on the precharging circuit 408 to precharge the sense amplifier input lines sil, silb at the beginning of the read operation.

Figure 5:
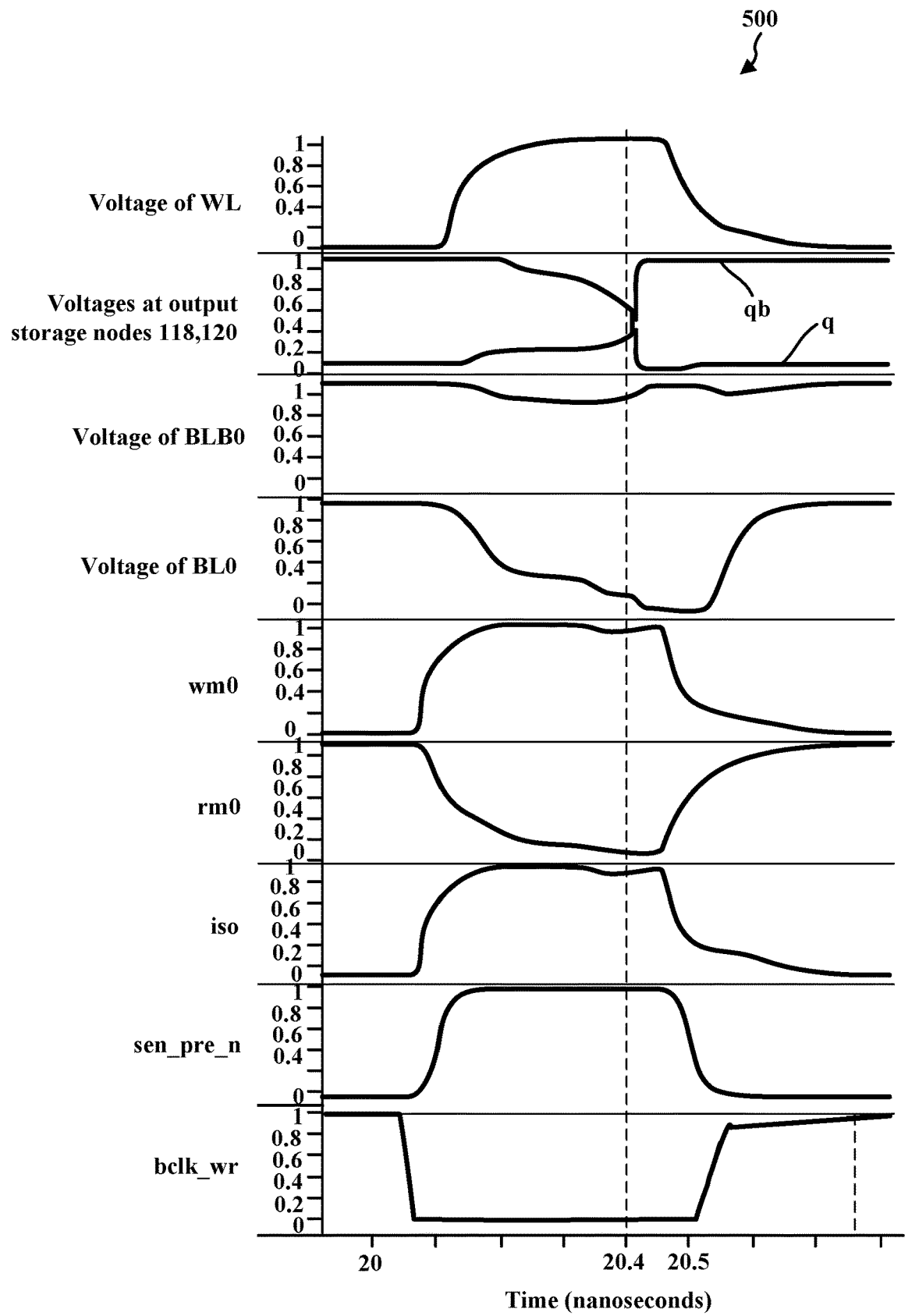
FIG. 5 is an exemplary signal diagram for the memory circuitry shown in FIG. 4 during an exemplary write operation.

FIG. 5 is a signal diagram 500 for an exemplary write operation provided by the memory 104 when the memory cell 102 is coupled to the pair of bit lines BL0, BLB0 of the memory circuitry 402 shown in FIG. 4. In FIG. 5, the power rail voltage VDD is equal to 1.082V and the memory 104 is SRAM provided by CMOS IC with a feature size of 14 nm. In this example, the stored bits q, qb are being changed from differential logical states of logic 1, logic 0 respectively to differential logical states of logic 0, logic 1, respectively. As shown in FIG. 5, the bit lines BL0, BLB0 have been precharged at the beginning of the write operation to approximately the power rail voltage VDD. Once the bit lines BL0, BLB0 have been precharged, the write clock data signal bclk_wr is driven to approximately the ground rail voltage GND, which corresponds to logic 0. Accordingly, the control voltages iso, sen_pre_n are both driven to approximately the power rail voltage VDD. This thus turns off the precharging circuit 408 and turns off the isolation PFETs 416 during the write operation.

Furthermore, the voltage of the word line WL is driven toward the power rail voltage VDD. The read select signal rm0 is driven to approximately to the ground rail voltage GND and the write select signal wm0 is driven to approximately the power rail voltage VDD thereby turning on the pair of read pass PFETs rp0, rpb0 and the pair of write pass NFETs wp0, wpb0 so that the multiplexer 404 selects the pair of bit lines BL0, BLB0. The write driver 406 then begins to drive the bit line BL0 toward the ground rail voltage GND at 0V and thus the bit line BL0 in this example is the zero bit line. Accordingly, the pull-up circuit 418 turns on the second stack of pull-up PFETs 424 to clamp the bit line BLB0 to approximately the power rail voltage through the read pass PFET rpb0 since the bit line BLB0 is the non-zero bit line. Once the voltage on the word line WL is sufficient to turn on the access NFETs 126, 128, the voltage of the bit line BL0 begins driving the output storage node 118 that stores the bit q towards the ground rail voltage GND. Furthermore, the voltage of the bit line BLB0 is configured to begin driving the output storage node 120 that stores the bit qb towards the power rail voltage VDD. Since the voltage of the bit line BLB0 is clamped at approximately the power rail voltage of VDD, the voltage difference between the bit lines BL0, BLB0 is much greater than in the example in FIG. 3. The dashed line indicates a time when the write driver 406 applies the negative boost voltage NBV to the bit line BL0. At this time, FIG. 5 shows that the voltage difference between the bit lines BL0, BLB0 was approximately 875.5 mV. As shown in FIG. 5, the feedback of the memory cell 102 may still prevent the voltages at the output storage nodes 118, 120 from being driven to the ground rail voltage GND and the power rail voltage VDD respectively without the write assist. Nevertheless, the boost capacitance required in order to cause the bits q, qb to flip may be smaller and lower since the voltage difference is greater using the memory circuitry of FIG. 4. Thus, less area and power are consumed by a boost capacitance in the write driver 406. Also, since the boost capacitance is lower, less time is required to drive the output storage nodes 118, 120 to the ground rail voltage GND and the power rail voltage VDD when the negative boost voltage NBV provided by the write driver 406 of FIG. 4 has the same magnitude as the negative boost voltage NBV provided by the write driver 206 of FIG. 2.

In FIG. 5, the write driver 406 is configured to apply the negative boost voltage NBV (in this example, −200 mV) to the global write data line gwl so that the bit line BL0 (i.e., the zero bit line in this example) is driven toward the negative boost voltage NBV. As such, the voltage difference between the bit lines BL0, BLB0 is sufficient to overcome the feedback of the memory cell 102. The voltage difference thereby drives the output storage node 118 that stores the bit q to approximately the ground rail voltage GND and thus logic 0 and drives the output storage node 120 that stores the bit qb to approximately the power rail voltage VDD so as to flip the logical states. However, upon application of the negative voltage boost NBV by the write driver 406, the voltages at the output storage node 118, 120 are driven to the ground rail voltage GND and the power rail voltage VDD faster than in the example provided in FIG. 3. More specifically, the memory circuitry 402 shown in FIG. 4 performs the write operation 0.15 ps faster than the memory circuitry 202 shown in FIG. 2.

Figure 6:
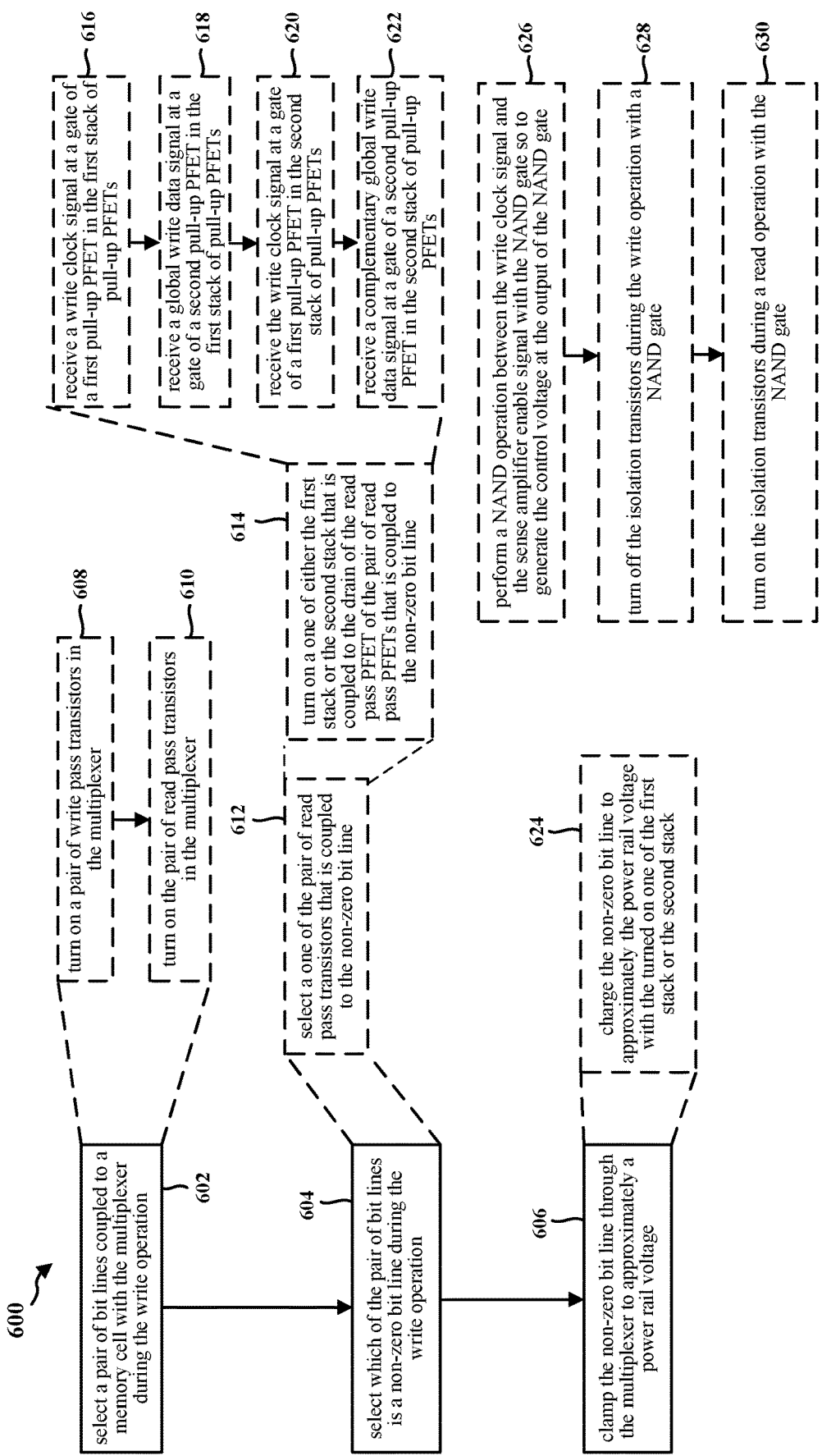
FIG. 6 is a flow chart of an exemplary method of performing a write operation in memory.

FIG. 6 is a flow chart 600 that illustrates an exemplary method of performing a write operation in the memory 104 (shown in FIG. 4). The method may be performed by the memory circuitry 402 (e.g., shown in FIG. 4.) At 602, the memory circuitry 402 selects a pair of bit lines (BL0, BLB0) coupled to a memory cell 102 (shown in FIG. 1) with the multiplexer 404 during a write operation. The memory circuitry 402 also selects which of the pair of bit lines (BL0, BLB0) is a non-zero bit line during the write operation at 604. To prevent the voltage of the non-zero bit line from drooping, the memory circuitry 402 clamps the non-zero bit line through the multiplexer 404 to approximately a power rail voltage at 606.

In one aspect, the multiplexer 404 may include a pair of write pass transistors (wp0, wpb0) that are each coupled to a different one of the pair of bit lines (BL0, BLB0) and a pair of write pass transistors (rp0, rpb0) that are each coupled to a different one of the pair of bit lines (BL0, BLB0). To select the pair of bit lines (BL0, BLB0) at 602, the memory circuitry 402 may turn on the pair of write pass transistors (wp0, wpb0) in the multiplexer 404 at 608 and may turn on the pair of write pass transistors (rp0, rpb0) in the multiplexer 404 at 610. For example, the pair of write pass transistors (wp0, wpb0) may be a pair of write pass NFETs (wp0, wpb0) and the pair of write pass transistors (rp0, rpb0) may be a pair of read pass PFETs (rp0, rpb0). The gates of the pair of write pass NFETs (wp0, wpb0) may be coupled to a write select line wsl0 and the gates of the pair of read pass PFETs (rp0, rpb0) may be coupled to a read select signal rsl0. One implementation of 608 may thus turn on the pair of write pass NFETs (wp0, wpb0) by asserting the write select line wsl0. In addition, one implementation of 610 may thus turn on the pair of read pass PFETs (rp0, rpb0) by asserting the read select signal rsl0.

Thus, in one aspect, the memory circuitry 402 may select which of the pair of bit lines (BL0, BLB0) is the non-zero bit line at 604 by selecting a one of the pair of write pass transistors (rp0, rpb0) that is coupled to the non-zero bit line at 612. As mentioned above, the pair of write pass transistors (rp0, rpb0) may be a pair of read pass PFETs (rp0, rpb0). A first stack of pull-up transistors 422 and a second stack of pull-up transistors 424 may be provided by the memory circuitry 402. The first stack of pull-up transistors 422 is coupled to a drain of one of the read pass PFETs (rp0) while the source of the read pass PFET (rp0) may be coupled to one of the bit lines (BL0). The second stack of pull-up transistors 424 is coupled to a drain of the other read pass PFET (rpb0) while the source of the other read pass PFET (rpb0) is coupled to the other bit line (BLB0). In one implementation of 612, the memory circuitry 402 may thus turn on a one of either the first stack 422 or the second stack 424 that is coupled to the drain of the read pass PFET of the pair of read pass PFETs (rp0, rpb0) that is coupled to the non-zero bit line at 614.

In some aspects, the first stack of pull-up transistors 422 are a first stack of pull-up PFETs 422 and the second stack of pull-up transistors 424 are a second stack of pull-up PFETs 424. Since the first stack 422 and the second stack 424 are coupled to the drains of the pair of read pass PFETs (rp0, rpb0), neither the first stack 422 or the second stack 424 should be turned on during read operations but the appropriate one of the stacks should be turned on to select the non-zero bit line during write operations. To do this, performing 614 may include performing 616, 618, 620, and 622.

More specifically, the memory circuitry 402 may receive a write clock signal at a gate of a first pull-up PFET in the first stack of pull-up PFETs 422 at 616. The write clock signal bck_wr may be low during the write operation and high during the read operation. In addition, the memory circuitry 402 may receive a at a gate of a second pull-up PFET in the first stack of pull-up PFETs 422 at 618. The global write data signal gdin may be low if the first stack of pull-up PFETs 422 are coupled to the drain of the read pass PFET rp0 that is connected to the non-zero bit line but may be high if the first stack of pull-up PFETs 422 are coupled to the drain of the read pass PFET rp0 that is connected to the zero bit line. Given 616, 618, the first stack of pull-up PFETs 422 is turned on when global write data signal gdin indicates that the bit line (BL0) coupled to the first stack of pull-up PFETs 422 is the non-zero bit line during the write operation. Furthermore, the memory circuitry 402 may receive the write clock signal bclk_wr at a gate of a first pull-up PFET in the second stack of pull-up PFETs 424 at 620. Additionally, the memory circuitry 402 may receive a complementary global write data signal gdin_n at a gate of a second pull-up PFET in the second stack of pull-up PFETs 424 at 622. Given 620, 622, the second stack of pull-up PFETs 424 is turned on when complementary global write data signal gdin_n indicates that the bit line (BLB0) coupled to the second stack of pull-up PFETs 424 is the non-zero bit line during the write operation.

In some aspects, the sense amplifier input lines (sil, silb) may be provided so that one sense amplifier input line (sil) is coupled between the drain of one of the read pass PFETs (rp0) and an isolation transistor 416 while the other sense amplifier line (silb) is coupled between the drain of the other read pass PFET (rpb0) and another isolation transistor 416. The first stack of pull-up PFETs 422 may be directly connected to one sense amplifier input line (sil) while the second stack of pull-up PFETs 424 is directly connected to the other sense amplifier input line (silb). Accordingly, when the memory circuitry 402 performs 614 by turning on the one of either the first stack 422 or the second stack 424 that is coupled to the non-zero bit line, the memory circuitry 402 may select a sense amplifier input line of the (sil, silb) coupled to the non-zero bit line.

In some aspects, the memory circuitry 402 may clamp the non-zero bit line to approximately the power rail voltage VDD at 606 through the selected one of the pair of write pass transistors (rp0, rpb0). At 624, the memory circuitry 402 may thus charge the non-zero bit line to approximately the power rail voltage VDD with the turned on one of the first stack 422 or the second stack 424 to perform 606. As mentioned above, the first and second stack 422, 424 may be coupled to a different one of a pair of (sil, silb). By turning on the first or the second stack 422, 424, the memory circuitry 402 may pull up the selected sense amplifier input line (sil, silb) that is connected to the non-zero bit line to approximately the power rail voltage VDD. The memory circuitry 402 may then apply a negative voltage boost NBV to the zero bit line to complete the write operation. In any case, by clamping the non-zero bit line through the multiplexer 404 to approximately the power rail voltage VDD, the voltage difference between the bit lines increases and thus the write sigma of the write operation is improved.

As mentioned above, some aspects of the memory circuitry 402 may pull up the one of the (sil, silb) that is coupled to the non-zero bit line in order to clamp the non-zero bit line to the power rail voltage VDD. Accordingly, the memory circuitry 402 should be operated to prevent false read operations by a sense amplifier during the write operation. Thus, at 626, the memory circuitry 402 may perform a NAND operation between the write clock signal bck_wr and a sense enable signal sen_global with the NAND gate 412 so to generate a control voltage iso at the output of the NAND gate 412. The write clock signal bck_wr may be the same write clock signal bck_wr received by one of the gates in each stacks 422, 424 of pull-up PFETs 422, 424. The output of the NAND gate 412 may be coupled to the gates of the isolation transistors 416 and thus the gates of the isolation transistors 416 may thus receive the control voltage iso at the output of the NAND gate 412.

Accordingly, at 628, the memory circuitry 402 turns off the isolation transistors 416 during the write operation with the NAND gate 412. For example, if the isolation transistors 416 are PFETs and the write clock signal is provided low during the write operation, the control voltage iso at the output of the NAND gate 412 will be high regardless of the logical state of the sense enable signal sen_global. Thus, the control voltage iso is generated by the NAND gate to pull up each of the gates and to turn off the isolation transistors 416 during the write operation. Accordingly, the sense amplifier is opaque during the write operation to prevent false reads.

At 630, the memory circuitry 402 may turn on the isolation transistors 416 during a read operation with the NAND gate 412. For example, if the isolation transistors 416 are PFETs and the write clock signal bck_wr and the sense enable signal sen_global are both provided high during the read operation, the control voltage iso at the output of the NAND gate 412 will be low. Thus, the control voltage iso is generated by the NAND gate 412 to pull down each of the gates and to turn on the isolation transistors 416 during the read operation. Accordingly, the sense amplifier is transparent and can thus read the logical states provided along the (sil, silb) during the read operation.

Referring again to FIG. 1 and FIG. 4, in one aspect, the memory 104 may include the memory cell 102 in FIG. 1 and the memory circuitry 402 shown in FIG. 4. The memory circuitry 402 in FIG. 4 includes a pair of bit lines (BL0, BLB0) coupled to the memory cell 102. The multiplexer 404 is configured to select the pair of bit lines (BL0, BLB0) coupled to the memory cell 102 during a write operation. Finally, the pull-up circuit 418 is coupled to the multiplexer 404. The pull-up circuit 418 is configured to select which of the pair of bit lines (BL0, BLB0) is a non-zero bit line during the write operation and to clamp the non-zero bit line through the multiplexer 404 to approximately a power rail voltage VDD.

As shown in FIG. 4, the multiplexer 404 includes a pair of write pass transistors (wp0, wpb0) (i.e., the pair of write pass NFETs wp0, wpb0) each coupled to a different one of the pair of bit lines (BL0, BLB0). In addition, the multiplexer 404 includes a pair of read pass transistors (i.e., the pair of read pass PFETs rp0, rpb0) each coupled to a different one of the pair of bit lines (BL0, BLB0). The multiplexer 404 is configured to select the pair of bit lines (BL0, BLB0) during the write operation by turning on the pair of write pass transistors (i.e., the pair of write pass NFETs wp0, wpb0) and turning on the pair of read pass transistors (i.e., the pair of read pass PFETs rp0, rpb0).

In FIG. 4, the memory circuitry 402 of the memory 104 includes a write select line wsl0 and a read select signal rsl0. Since the write select signal wm0 is high during the write operation, the write select line wsl0 is configured to be asserted when the pair of bit lines (BL0, BLB0) are selected for the write operation. In addition, since the read select signal rm0 is low during the write operation, the read select signal rsl0 is configured to be unasserted when the pair of bit lines (BL0, BLB0) are selected for the write operation. First gates of the pair of write pass NFETs wp0, wpb0 are coupled to the write select line wsl0 so that the pair of write pass NFETs wp0, wpb0 are turned on when the write select line wsl0 is asserted. Furthermore, second gates of the pair of read pass PFETs rp0, rpb0 are coupled to the read select signal rsl0 so that the pair of read pass PFETs rp0, rpb0 are turned on when the read select signal rsl0 is unasserted.

In FIG. 4, the pull-up circuit 418 is coupled to the pair of read pass transistors (i.e., the pair of read pass PFETs rp0, rpb0). The pull-up circuit 418 is configured to select which of the pair of bit lines (BL0, BLB0) is the non-zero bit line by selecting a one of the pair of read pass transistors (i.e., the pair of read pass PFETs rp0, rpb0) that is coupled to the non-zero bit line. In addition, the pull-up circuit 418 is configured to clamp the non-zero bit line to approximately the power rail voltage through the selected one of the pair of read pass transistors (i.e., the pair of read pass PFETs rp0, rpb0).

To select and clamp the non-zero bit line, the pull-up circuit 418 includes a stack of pull-up transistors 422 coupled to a drain of the read pass PFET rp0 and a stack of pull-up transistors 424 coupled to a drain of the read pass PFET rpb0. The pull-up circuit 418 is configured to select which of the pair of bit lines (BL0, BLB0) is the non-zero bit line by turning on a one of either the stack of pull-up transistors 422 or the stack of pull-up transistors 424 that is coupled to the drain of the read pass PFET rpb0 of the pair of read pass PFETs rp0, rpb0 that is coupled to the non-zero bit line. In FIG. 5, the non-zero bit line is the bit line (BLB0) and thus the stack of pull-up PFETs 424 is turned on while the stack of pull-up PFETs 422 remains off. Accordingly, in the example provided by FIG. 5, the pull-up circuit 418 in FIG. 4, clamps the non-zero bit line (BLB0) to approximately the power rail voltage VDD by charging the non-zero bit line (BLB0) to approximately the power rail voltage VDD with the turned on stack of pull-up PFETs 424.

To ensure that the pull-up circuit 418 does not interfere with read operations, a first pull-up PFET in the stack of pull-up PFETs 422 includes a gate configured to receive a write clock signal bclk_wr and a first pull-up PFET in the stack of pull-up PFETs 424 includes a gate configured to receive the write clock signal bclk_wr. Since the write clock signal bclk_wr is low during the write operation but high otherwise, the stacks of pull-up PFETs 422, 424 cannot interfere with read operations. Furthermore, a second pull-up PFET in the stack of pull-up PFETs 422 includes a gate configured to receive a global write data signal gdin and a second pull-up PFET in the stack of pull-up PFETs 424 includes a gate configured to receive a complementary global write data signal gdin_n. Thus, the pull-up circuit 418 is configured to select and clamp the non-zero bit line.

As shown in FIG. 4, sense amplifier input lines (sil, silb) are each coupled through the multiplexer 404 to a different one of the pair of bit lines (BL0, BLB0). Since the stack of pull-up PFETs 422 is coupled to the sense amplifier input line sil and the stack of pull-up PFETs 424 is coupled to the sense amplifier input line silb, the pull-up circuit 418 is configured to select which of the pair of bit lines (BL0, BLB0) is the non-zero bit line by selecting a sense amplifier input line of the sense amplifier input lines (sil, silb) coupled to the non-zero bit line. Furthermore, the pull-up circuit 418 is configured to clamp the non-zero bit line through the multiplexer 404 to approximately the power rail voltage VDD by pulling up the selected sense amplifier input line to approximately the power rail voltage VDD. In the example given by FIG. 5, the stack of pull-up PFETs 424 is turned on and thus the pull-up circuit 418 selects the sense amplifier input line silb and pulls up the selected sense amplifier input line silb to clamp the non-zero bit line (BLB0) to approximately the power rail voltage VDD.

To prevent false read operations during the write operation, isolation transistors 416 that are each coupled to a different one of the sense amplifier input lines (sil, silb). As shown in FIG. 4, the pull-up circuit 418 is coupled between the isolation transistors 416 and the multiplexer 404. To control the isolation transistors 416, a NAND gate 412 configured to turn off the isolation transistors 416 during the write operation and to turn on the isolation transistors 416 during a read operation. The isolation transistors 416 are isolation PFETs. The NAND gate 412 is configured to pull up each of the gates of the isolation PFETs 416 so as to turn off the isolation PFETs 416 during the write operation. Furthermore, the NAND gate 412 is configured to pull down each of the gates so as to turn on each of the isolation PFETs during the read operation. More specifically, the NAND gate 412 comprises an output coupled to each of the gates of the isolation PFETs and, wherein the NAND gate 412 is configured to perform a NAND operation between a write clock signal bckl_wr and the sense enable signal sen_global so to generate a control voltage iso at the output that pulls up each of the gates of the isolation PFETs during the write operation and pulls down each of the gates during the read operation.

Referring again to FIG. 1 and FIG. 4, the memory circuitry 402 shown in FIG. 4 provides an apparatus for performing a write operation in a memory 104. More specifically, the memory circuitry 402 provide a means for selecting a pair of bit lines BL0, BLB0 coupled to a memory cell 102 (shown in FIG. 1) during the write operation with the multiplexer 404, the read select line rsl0 that receives the read select signal rm0, and the write select line wsl0 that receives the write select signal wm0. The means for selecting the pair of bit lines (BL0, BLB0) during the write operation thus include a pair of write pass transistors (a pair of write pass NFETs wp0, wpb0) and a pair of read pass transistors (a pair of read pass PFETs rp0, rpb0). The pair of write pass transistors (the pair of write pass NFETs wp0, wpb0) are each coupled to a different one of the pair of bit lines (BL0, BLB0) and the pair of read pass transistors (the pair of read pass PFETs rp0, rpb0) are each coupled to a different one of the pair of bit lines (BL0, BLB0). In FIG. 4, the read select line rsl0 that receives the read select signal rm0 is configured to turn on the pair of write pass transistors (rp0, rpb0) and, more specifically, is configured to turn on the pair of read pass PFETs rp0, rpb0. The write select line wsl0 that receives the write select signal wm0 is configured to turn on the pair of write pass transistors (wp0, wpb0) and, more specifically, is configured to turn on the pair of write pass NFETs wp0, wpb0.

The gates of the stack of pull-up PFETs 422 and the gates of the stack of pull-up PFETs 424 in the pull-up circuit 418 provide a means for selecting which of the pair of bit lines (BL0, BLB0) is a non-zero bit line during the write operation. More specifically, the gate of the top PFET in the stack of pull-up PFETs 422 and the gate of the top PFET in the stack of pull-up PFETs 424 both receive the write clock signal, thereby insuring that the stack of pull-up PFETs 422 and the stack of pull-up PFETs 424 may only be turned on during the write operation. Furthermore, the gate of the bottom PFET in the first stack of pull-up PFETs 422 receives a global write data signal gdin and the gate of the bottom PFET in the second stack of pull-up PFETs 424 receives the complementary global write data signal gdin_n. Accordingly, when the global write data signal gdin is at logic 0, the non-zero bit line is the bit line BL0. Thus, the pull-up circuit 418 turns on the stack of pull-up PFETs 422 during the write operation. On the other hand, when the global write data signal gdin_n is at logic 0, the non-zero bit line is the bit line BLB0. Accordingly, the pull-up circuit 418 turns on the stack of pull-up PFETs 424. In the example given in FIG. 5, the bit line BLB0 is driven towards the power rail voltage VDD and thus the bit line BLB0 is the non-zero bit line. Furthermore, the bit line BL0 is driven toward the ground rail voltage GND at 0V and thus the bit line BL0 in FIG. 5 is the zero bit line. Accordingly, the pull-up circuit 418 turns on the stack of pull-up PFETs 424.

Referring again specifically to FIG. 4, note that the stack of pull-up PFETs 422 is coupled to a sense amplifier input line sil and the stack of pull-up PFETs 424 is coupled to the sense amplifier input line silb. Thus, the gates of the stack of pull-up PFETs 422 and the gates of the stack of pull-up PFETs 424 in the pull-up circuit 418 also are configured to select a sense amplifier input line of sense amplifier input lines (sil, silb) coupled to the non-zero bit line. Additionally, the sense amplifier input line sil is coupled to the drain of the read pass PFET rp0 and the sense amplifier input line silb is coupled to the drain of the read pass PFET rpb0. Accordingly, the gates of the first stack of pull-up PFETs 422 and the gates of the second stack of pull-up PFETs 424 in the pull-up circuit 418 also are configured to select a one of the pair of read pass transistors (one of the read pass PFETs rp0, rpb0) that is coupled to the non-zero bit line. In FIG. 5, the sense amplifier input line silb and the read pass PFET rpb0 are selected as being coupled to the non-zero bit line (BLB0).

Referring again to FIG. 4, the pull-up circuit 418 provides a means for clamping the non-zero bit line (i.e., whichever one of the bit lines BL0, BLB0 is driven to logic 1 during the write operation) to approximately a power rail voltage VDD through the means for selecting the pair of bit lines (BL0, BLB0) coupled to the memory cell 102. Again, the multiplexer 404 provides at least part of the means for selecting the pair of bit lines (BL0, BLB0) coupled to the memory cell 102. As explained above, the stack of pull-up PFETs 422 and the stack of pull-up PFETs 424 are each coupled to a different one of the sense amplifier input lines (sil, silb) and the sense amplifier input lines (sil, silb) are each coupled to a different one of the drains of the read pass PFETs (rp0, rpb0). The stack of pull-up PFETs 422 and the stack of pull-up PFETs 424 thus are configured to pull up the selected sense amplifier input line sil, silb (i.e., the sense amplifier input line sil, silb coupled to the non-zero bit line) to approximately the power rail voltage VDD. Additionally, the pull-up circuit 418 provides the means for clamping the non-zero bit line to approximately the power rail voltage VDD through the drain of the selected one of the pair of read pass transistors rp0, rpb0. In FIG. 5, the sense amplifier input line silb and the drain of the read pass PFET rpb0 are pulled up to approximately the power rail voltage VDD by the stack of pull-up PFETs 424 because the sense amplifier input line silb and the drain of the read pass PFET rpb0 are coupled to the non-zero bit line (BLB0 in the example of FIG. 5).

Furthermore, the pull-up circuit 418 is configured to charge the non-zero bit line to approximately the power rail voltage VDD through the drain of the read pass PFET of the pair of read pass PFETs rp0, rpb0 that is coupled to the non-zero bit line. With respect to FIG. 5, the stack of pull-up PFETs 424 is turned on and charges the non-zero bit line (BLB0) to approximately the power rail voltage VDD through the drain of the read pass PFET rbp0 that is coupled to the bit line BLB0, which is the non-zero bit line.

Isolation transistors 416 are coupled to the sense amplifier lines (sil, silb) in the memory circuitry 402. The NAND gate 412 provides means for turning off the isolation transistors 416 during a write operation and turning on the isolation transistors 416 during a read operation. In the implementation shown in FIG. 4, the gates of the isolation transistors 416 receive a control voltage iso from the NAND gate 412. An input of the NAND gate 412 is configured to receive the write clock signal bclk_wr and another input of the NAND gate 412 is configured to receive a global sense enable signal sen_global. By performing the NAND operation on the write clock signal bclk_wr and the global sense enable signal sen_global, the control voltage iso turns off the isolation transistors 416 during the write operation and turns on the isolation transistors 416 during the read operation. Accordingly, false read operation are avoided by the memory circuitry 402.

Since the pull-up circuit 418 clamps the voltage of the non-zero bit line (e.g, BLB0 in FIG. 5) at approximately the power rail voltage of VDD, the voltage difference between the bit lines BL0, BLB0 is much greater during the write operation than if the voltage of the non-zero bit line were allowed to drop during the write operation. Accordingly, the boost capacitance in the write driver 406 that provides the negative boost voltage NBV (to flip the logical states of the bits q, qb of the memory cell 102 and complete the write operation) may be smaller and lower. Thus, less area and power are consumed by the boost capacitance in the write driver 406. Also, since the boost capacitance is lower, less time is required to drive the output storage nodes 118, 120 of the memory cell 102 to the ground rail voltage GND and the power rail voltage VDD and thus faster write operations may also be provided by the memory circuitry 402 shown in FIG. 4.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. An apparatus, comprising:
a memory cell;
a pair of bit lines coupled to the memory cell;
a precharge circuit coupled between the pair of bit lines, wherein the precharge circuit is configured to precharge each of the bit lines to approximately a power rail voltage to begin a write operation;
a multiplexer configured to select the pair of bit lines coupled to the memory cell during the write operation and after the precharge circuit is turned off; and
a pull-up circuit coupled to the multiplexer, the pull-up circuit configured to:
select, after the write operation begins, which one of the pair of bit lines is a non-zero bit line driven to a logic high; and
increase a voltage difference between the non-zero bit line and a zero bit line of the pair of bit lines to flip logical states of stored bits by clamping the selected non-zero bit line through the multiplexer to approximately the power rail voltage during the write operation.

2. The apparatus of claim 1, wherein the multiplexer comprises a pair of write pass transistors each coupled to a different one of the pair of bit lines and a pair of read pass transistors each coupled to a different one of the pair of bit lines, wherein the multiplexer is configured to select the pair of bit lines during the write operation by turning on the pair of write pass transistors and turning on the pair of read pass transistors.

3. The apparatus of claim 2, wherein the pull-up circuit is coupled to the pair of read pass transistors, wherein the pull-up circuit is configured to:
select which one of the pair of bit lines is the non-zero bit line by selecting a one of the pair of read pass transistors that is coupled to the non-zero bit line; and
clamp the one selected non-zero bit line to approximately the power rail voltage through the selected one of the pair of read pass transistors.

4. The apparatus of claim 1, further comprising a write select line and a read select line, wherein:

the multiplexer comprises a pair of write pass n-channel field effect transistors (NFETs) and a pair of read pass p-channel field effect transistors (PFETs);
the write select line is configured to be asserted when the pair of bit lines are selected for the write operation;
the read select line is configured to be unasserted when the pair of bit lines are selected for the write operation;
first gates of the pair of write pass NFETs are coupled to the write select line so that the pair of write pass NFETs are turned on when the write select line is asserted; and
second gates of the pair of read pass PFETs are coupled to the read select line so that the pair of read pass PFETs are turned on when the read select line is unasserted.

5. The apparatus of claim 4, wherein the pull-up circuit comprises a first stack of pull-up transistors coupled to a drain of one of the pair of read pass PFETs and a second stack of pull-up transistors coupled to a drain of another one of the pair of read pass PFETs, wherein the pull-up circuit is configured to:
select which one of the pair of bit lines is the non-zero bit line by turning on a one of either the first stack of pull-up transistors or the second stack of pull-up transistors that is coupled to the drain of a read pass PFET of the pair of read pass PFETs that is coupled to the non-zero bit line; and
clamp the one selected non-zero bit line to approximately the power rail voltage by charging the non-zero bit line to approximately the power rail voltage with the turned on one of the first stack of pull-up transistors or the second stack of pull-up transistors.

6. The apparatus of claim 5, wherein the first stack of pull-up transistors comprises a first stack of pull-up PFETs and the second stack of pull-up transistors comprises a second stack of pull-up PFETs and, wherein:
a first pull-up PFET in the first stack of pull-up PFETs comprising a gate configured to receive a write clock signal;
a second pull-up PFET in the first stack of pull-up PFETs comprising a gate configured to receive a global write data signal;
a first pull-up PFET in the second stack of pull-up PFETs comprising a gate configured to receive the write clock signal; and
a second pull-up PFET in the second stack of pull-up PFETs comprising a gate configured to receive a complementary global write data signal.

7. The apparatus of claim 1, further comprising sense amplifier input lines that are each coupled through the multiplexer to a different one of the pair of bit lines, the pull-up circuit being configured to select which one of the pair of bit lines is the non-zero bit line by selecting a sense amplifier input line of the sense amplifier input lines coupled to the non-zero bit line.

8. The apparatus of claim 7, wherein the pull-up circuit is configured to clamp the one selected non-zero bit line through the multiplexer to approximately the power rail voltage by pulling up the selected sense amplifier input line to approximately the power rail voltage.

9. The apparatus of claim 1, further comprising:
sense amplifier input lines that are each coupled through the multiplexer to a different one of the pair of bit lines;
isolation transistors that are each coupled to a different one of the sense amplifier input lines, wherein the pull-up circuit is coupled between the isolation transistors and the multiplexer; and a NAND gate configured to turn off the isolation transistors during the write operation and to turn on the isolation transistors during a read operation.

10. The apparatus of claim 9, wherein the isolation transistors comprise isolation p-channel field effect transistors (PFETs) having gates, wherein the NAND gate is configured to pull up each of the gates so as to turn off the isolation PFETs during the write operation and is configured to pull down each of the gates so as to turn on each of the isolation PFETs during the read operation.

11. The apparatus of claim 10, wherein the NAND gate comprises an output coupled to each of the gates of the isolation PFETs and, wherein the NAND gate is configured to perform a NAND operation between a write clock signal and a sense enable signal so to generate a control voltage at the output that pulls up each of the gates during the write operation and pulls down each of the gates during the read operation.

12. The apparatus of claim 1, further comprising:
one of a mobile phone, personal digital assistant (PDA), Internet of Things device, desktop computer, laptop computer, palm-sized computer, tablet computer, work station, game console, media player, computer based simulators, and wireless communication attachments for laptops incorporating the memory cell, the pair of bit lines, the multiplexor, and the pull-up circuit.

13. A method of performing a write operation in a memory, comprising:
precharging bit lines coupled to a memory cell to approximately a power rail voltage to begin the write operation;
after turning off the precharging of the bit lines, selecting a pair of bit lines coupled to the memory cell with a multiplexer during the write operation;
selecting, after the write operation begins, which one of the pair of bit lines is a non-zero bit line driven to a logic high; and
increasing a voltage difference between the non-zero bit line and a zero bit line of the pair of bit lines to flip logical states of stored bits by clamping the selected non-zero bit line through the multiplexer to approximately the power rail voltage during the write operation.

14. The method of claim 13, wherein selecting the pair of bit lines during the write operation comprises:
turning on a pair of write pass transistors in the multiplexer, wherein the pair of write pass transistors are each coupled to a different one of the pair of bit lines; and
turning on a pair of read pass transistors in the multiplexer, wherein the pair of read pass transistors are each coupled to a different one of the pair of bit lines.

15. The method of claim 14, wherein:
selecting which one of the pair of bit lines is the non-zero bit line comprises selecting a one of the pair of read pass transistors that is coupled to the non-zero bit line; and
clamping the one selected non-zero bit line to approximately the power rail voltage is through the selected one of the pair of read pass transistors.

16. The method of claim 13, wherein the multiplexer comprises a pair of write pass n-channel field effect transistors (NFETs), first gates of the pair of write pass NFETs coupled to a write select line, a pair of read pass p-channel field effect transistors (PFETs), and second gates of the pair of read pass PFETs coupled to a read select line and, wherein selecting the pair of bit lines coupled to the memory cell with the multiplexer during the write operation, comprises:
turning on the pair of write pass NFETs by asserting the write select line; and
turning on the pair of read pass PFETs by unasserting the read select line.

17. The method of claim 16, wherein a first stack of pull-up transistors is coupled to a drain of one of the pair of read pass PFETs and a second stack of pull-up transistors is coupled to a drain of another one of the pair of read pass PFETs and, wherein:
selecting which one of the pair of bit lines is the non-zero bit line comprises turning on a one of either the first stack of pull-up transistors or the second stack of pull-up transistors that is coupled to the drain of a read pass PFET of the pair of read pass PFETs that is coupled to the non-zero bit line; and
clamping the one selected non-zero bit line to approximately the power rail voltage comprises charging the non-zero bit line to approximately the power rail voltage with the turned on one of the first stack of pull-up transistors or the second stack of pull-up transistors.

18. The method of claim 17, wherein the first stack of pull-up transistors comprises a first stack of pull-up PFETs and the second stack of pull-up transistors comprises a second stack of pull-up PFETs and, wherein selecting which one of the pair of bit lines is the non-zero bit line comprises:
receiving a write clock signal at a gate of a first pull-up PFET in the first stack of pull-up PFETs;
receiving a global write data signal at a gate of a second pull-up PFET in the first stack of pull-up PFETs;
receiving the write clock signal at a gate of a first pull-up PFET in the second stack of pull-up PFETs; and
receiving a complementary global write data signal at a gate of a second pull-up PFET in the second stack of pull-up PFETs.

19. The method of claim 13, wherein sense amplifier input lines are each coupled through the multiplexer to a different one of the pair of bit lines and, wherein selecting which one of the pair of bit lines is the non-zero bit line comprises selecting a sense amplifier input line of the sense amplifier input lines coupled to the non-zero bit line.

20. The method of claim 19, wherein clamping the one selected non-zero bit line through the multiplexer to approximately the power rail voltage comprises pulling up the selected sense amplifier input line to approximately the power rail voltage.

21. The method of claim 13, wherein sense amplifier input lines are each coupled through the multiplexer to a different one of the pair of bit lines and isolation transistors are each coupled to a different one of the sense amplifier input lines and, wherein the method further comprises turning off the isolation transistors during the write operation with a NAND gate and turning on the isolation transistors during a read operation with the NAND gate.

22. The method of claim 21, wherein the isolation transistors comprise isolation p-channel field effect transistors (PFETs) having gates and, wherein:
turning off the isolation transistors during the write operation with the NAND gate comprises pulling up each of the gates so as to turn off the isolation PFETs with the NAND gate; and
turning on the isolation transistors during the read operation with the NAND gate comprises pulling down each of the gates so as to turn on each of the isolation PFETs during the read operation.

23. The method of claim 22, wherein the NAND gate comprises an output coupled to each of the gates of the isolation PFETs and, wherein pulling up each of the gates during the write operation and pulling down each of the gates during the read operation comprises performing a NAND operation between a write clock signal and a sense enable signal with the NAND gate so to generate a control voltage at the output of the NAND gate.

24. An apparatus for performing a write operation in a memory, comprising:
a memory cell;
a pair of bit lines coupled to the memory cell;
a pair of write pass transistors each coupled to a different one of the pair of bit lines and a pair of read pass transistors each coupled to a different one of the pair of bit lines, wherein the pair of write pass transistors and the pair of read pass transistors are configured to couple to the pair of bit lines in a write operation, and only the pair of read pass transistors is configured to couple to the pair of bit lines in a read operation;
sense amplifier input lines that are each coupled to a different one of the pair of read pass transistors; and
a pull-up circuit being configured to select a sense amplifier input line of the sense amplifier input lines coupled to a one of the pair of read pass transistors that is coupled to a non-zero bit line of the pair of bit lines during the write operation and clamp the non-zero bit line to approximately a power rail voltage by pulling up the selected sense amplifier input line to approximately the power rail voltage.

25. The apparatus of claim 24, further comprising:
a precharge circuit coupled between the pair of bit lines, wherein the precharge circuit is configured to precharge each of the bit lines to approximately a power rail voltage to begin the write operation; and
a pull-up circuit coupled to the pair of read pass transistors, wherein the pull-up circuit is configured to, after the precharge circuit is turned off, select a one of the pair of read pass transistors coupled to a non-zero bit line of the pair of bit lines driven to a logic high after the write operation begins and to increase a voltage difference between the non-zero bit line and a zero bit line of the pair of bit lines to flip logical states of stored bits by clamping the selected non-zero bit line through the one of the pair of read pass transistors to approximately the power rail voltage during the write operation.

26. The apparatus of claim 25, further comprising a write select line and a read select line, wherein:
the pair of write pass transistors are a pair of write pass n-channel field effect transistors (NFETs) and the pair of read pass transistors are a pair of read pass p-channel field effect transistors (PFETs);
the write select line is configured to be asserted when the pair of bit lines are selected for the write operation;
the read select line is configured to be unasserted when the pair of bit lines are selected for the write operation;
first gates of the pair of write pass NFETs are coupled to the write select line so that the pair of write pass NFETs are turned on when the write select line is asserted; and
second gates of the pair of read pass PFETs are coupled to the read select line so that the pair of read pass PFETs are turned on when the read select line is unasserted.

27. The apparatus of claim 26, further comprising a first stack of pull-up transistors coupled to a drain of one of the pair of read pass PFETs and a second stack of pull-up transistors coupled to a drain of another one of the pair of read pass PFETs, wherein the pull-up circuit is configured to:
turning on a one of either the first stack of pull-up transistors or the second stack of pull-up transistors that is coupled to the drain of a read pass PFET of the pair of read pass PFETs that is coupled to a non-zero bit line of the pair of bit lines during the write operation; and
clamp the non-zero bit line to approximately the power rail voltage by charging the non-zero bit line to approximately the power rail voltage with the turned on one of the first stack of pull-up transistors or the second stack of pull-up transistors.

28. The apparatus of claim 27, wherein the first stack of pull-up transistors comprises a first stack of pull-up PFETs and the second stack of pull-up transistors comprises a second stack of pull-up PFETs and, wherein:
a first pull-up PFET in the first stack of pull-up PFETs comprising a gate configured to receive a write clock signal;
a second pull-up PFET in the first stack of pull-up PFETs comprising a gate configured to receive a global write data signal;
a first pull-up PFET in the second stack of pull-up PFETs comprising a gate configured to receive the write clock signal; and
a second pull-up PFET in the second stack of pull-up PFETs comprising a gate configured to receive a complementary global write data signal.

29. The apparatus of claim 24, further comprising:
isolation transistors that are each coupled to a different one of the sense amplifier input lines, wherein the pull-up circuit is coupled between the isolation transistors and the pair of read pass transistors; and
a NAND gate configured to turn off the isolation transistors during the write operation and to turn on the isolation transistors during the read operation.

30. The apparatus of claim 29, wherein the isolation transistors comprise isolation p-channel field effect transistors (PFETs) having gates, wherein the NAND gate is configured to pull up each of the gates so as to turn off the isolation PFETs during the write operation and is configured to pull down each of the gates so as to turn on each of the isolation PFETs during the read operation.

31. The apparatus of claim 30, wherein the NAND gate comprises an output coupled to each of the gates of the isolation PFETs and, wherein the NAND gate is configured to perform a NAND operation between a write clock signal and a sense enable signal so to generate a control voltage at the output that pulls up each of the gates during the write operation and pulls down each of the gates during the read operation.

32. The apparatus of claim 25, further comprising:
one of a mobile phone, personal digital assistant (PDA), Internet of Things device, desktop computer, laptop computer, palm-sized computer, tablet computer, work station, game console, media player, computer based simulators, and wireless communication attachments for laptops incorporating the memory cell, the pair of bit lines, and the pull-up circuit.

* * * * *